United States Patent
Son et al.

(10) Patent No.: US 8,923,057 B2
(45) Date of Patent: Dec. 30, 2014

(54) THREE-DIMENSIONAL SEMICONDUCTOR MEMORY DEVICE WITH ACTIVE PATTERNS AND ELECTRODES ARRANGED ABOVE A SUBSTRATE

(75) Inventors: Yong-Hoon Son, Yongin-si (KR); Myoung Bum Lee, Seoul (KR); Ki Hyun Hwang, Seongnam-si (KR); Seung Jae Baik, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 285 days.

(21) Appl. No.: 12/981,625

(22) Filed: Dec. 30, 2010

(65) Prior Publication Data
US 2011/0199804 A1    Aug. 18, 2011

(30) Foreign Application Priority Data
Feb. 18, 2010    (KR) .......................... 10-2010-0014751

(51) Int. Cl.
G11C 16/04 (2006.01)
H01L 29/66 (2006.01)
H01L 27/115 (2006.01)
G11C 5/04 (2006.01)
G11C 5/06 (2006.01)

(52) U.S. Cl.
CPC ............ H01L 27/11551 (2013.01); G11C 5/04 (2013.01); G11C 5/063 (2013.01); H01L 27/11556 (2013.01); H01L 27/11578 (2013.01); H01L 27/11582 (2013.01)

USPC ................... 365/185.17; 365/185.05; 365/51; 365/63; 257/329; 257/210; 257/211; 257/208

(58) Field of Classification Search
USPC ...................... 365/51, 72, 63, 185.17, 185.05; 257/329, 210, 211, 208, 686
See application file for complete search history.

(56) References Cited

U.S. PATENT DOCUMENTS

| 7,619,279 | B2 * | 11/2009 | Lindsay et al. ............... 257/329 |
| 7,619,916 | B2 * | 11/2009 | Goel .............................. 365/156 |
| 7,929,330 | B2 * | 4/2011 | Kim et al. ....................... 365/94 |
| 2008/0149913 | A1 | 6/2008 | Tanaka et al. |
| 2008/0179659 | A1 | 7/2008 | Enda et al. |
| 2009/0097309 | A1 | 4/2009 | Mizukami et al. |

FOREIGN PATENT DOCUMENTS

| JP | 2007-317874 | 6/2007 |
| JP | 2008-160004 | 10/2008 |
| KR | 1020080070583 A | 7/2008 |
| KR | 1020090034776 A | 4/2009 |

* cited by examiner

Primary Examiner — Andrew Q Tran
(74) Attorney, Agent, or Firm — Volentine & Whitt, PLLC

(57) ABSTRACT

A three-dimensional semiconductor device comprises active patterns arranged two-dimensionally on a substrate, electrodes arranged three-dimensionally between the active patterns, and memory regions arranged three-dimensionally at intersecting points defined by the active patterns and the electrodes. Each of the active patterns is used as a common current path for an electrical connection to two different memory regions that are formed at the same height from the substrate.

17 Claims, 45 Drawing Sheets

Fig. 21

| Program Operation | | | | | | | | | | | |
|---|---|---|---|---|---|---|---|---|---|---|---|
| BL0 | GND | | | | | | | | | | |
| SSL1 | GND | Off | SSL2 | Vcc | GND | SSL3 | GND | Off | SSL4 | GND | Off |
| WL31 | GND | Floating | WL32 | Vpass | GND | WL33 | GND | Floating | WL34 | Vpass | Boost |
| WL21 | GND | Floating | WL22 | Vpgm ← | GND | WL23 | GND | Floating | WL24 | Vpgm | Boost |
| WL11 | GND | Floating | WL12 | Vpass | GND | WL13 | GND | Floating | WL14 | Vpass | Boost |
| WL01 | GND | Floating | WL02 | Vpass | GND | WL03 | GND | Floating | WL04 | Vpass | Boost |
| GSL1 | GND | Off | GSL2 | GND | Off | GSL3 | GND | Off | GSL4 | GND | Off |
| CSL | - | | | | | | | | | | |
| Bulk | - | | | | | | | | | | |
| BL1~n | Vcc | | | | | | | | | | |

Fig. 22

| | | Erase Operation | | | |
|---|---|---|---|---|---|
| | | | GND | | |
| BL0 | | | | | |
| | SSL1 | – | SSL2 | – | SSL3 | – | SSL4 | – |
| | WL31 | GND → Verase | WL32 | GND → Verase | WL33 | GND → Verase | WL34 | GND → Verase |
| | WL21 | GND → Verase | WL22 | GND → Verase | WL23 | GND → Verase | WL24 | GND → Verase |
| | WL11 | GND → Verase | WL12 | GND → Verase | WL13 | GND → Verase | WL14 | GND → Verase |
| | WL01 | GND → Verase | WL02 | GND → Verase | WL03 | GND → Verase | WL04 | GND → Verase |
| | GSL1 | – | GSL2 | – | GSL3 | – | GSL4 | – |
| CSL | | – | | | |
| Bulk | | Verase | | | |

Fig. 23

| | | | | | Read Operation | | | | |
|---|---|---|---|---|---|---|---|---|---|
| BL0 | | | | | V1 | | | | |
| SSL1 | GND | Off | SSL2 | Vread | V1 | SSL3 | GND | Off | SSL4 | GND | Off |
| WL31 | GND | Floating | WL32 | Vread | V1 | WL33 | GND | Floating | WL34 | Vread | – |
| WL21 | GND | Floating | WL22 | GND | [on/off] | WL23 | GND | Floating | WL24 | GND | – |
| WL11 | GND | Floating | WL12 | Vread | GND | WL13 | GND | Floating | WL14 | Vread | GND |
| WL01 | GND | Floating | WL02 | Vread | GND | WL03 | GND | Floating | WL04 | Vread | GND |
| GSL1 | GND | Off | GSL2 | Vread | GND | GSL3 | GND | Off | GSL4 | Vread | GND |
| CSL | | | | | GND | | | | |
| Bulk | | | | | – | | | | |

Fig. 24

| Program Operation | | | | | | | | | | | |
|---|---|---|---|---|---|---|---|---|---|---|---|
| BL0 | GND | | | | | | | | | | |
| SSL1 | GND | Off | SSL2 | Vcc | GND | SSL3 | GND | Off | SSL4 | GND | Off |
| WL31 | GND | Floating | WL32 | Vpass | GND | WL33 | Vpass | Boost | WL34 | GND | Floating |
| WL21 | GND | Floating | WL22 | Vpgm | ← GND | WL23 | Vpgm | Boost | WL24 | GND | Floating |
| WL11 | GND | Floating | WL12 | Vpass | GND | WL13 | Vpass | Boost | WL14 | GND | Floating |
| WL01 | GND | Floating | WL02 | Vpass | GND | WL03 | Vpass | Boost | WL04 | GND | Floating |
| GSL1 | GND | Off | GSL2 | GND | Off | GSL3 | GND | Off | GSL4 | GND | Off |
| CSL | | | | | | – | | | | | |
| Bulk | | | | | | – | | | | | |
| BL1~n | Vcc | | | | | | | | | | |

Fig. 25

| | | Read Operation | | | | |
|---|---|---|---|---|---|---|
| BL0 | | | V1 | | | |
| SSL1 | GND | Off | SSL2 | Vread | V1 | SSL3 | GND | Off | SSL4 | GND |

| | | | | | | | | | | |
|---|---|---|---|---|---|---|---|---|---|---|
| SSL1 | GND | Off | SSL2 | Vread | V1 | SSL3 | GND | Off | SSL4 | GND |
| WL31 | GND | Floating | WL32 | Vread | V1 | WL33 | Vread | — | WL34 | Floating |
| WL21 | GND | Floating | WL22 | GND | [on/off] | WL23 | GND | — | WL24 | Floating |
| WL11 | GND | Floating | WL12 | Vread | GND | WL13 | Vread | GND | WL14 | Floating |
| WL01 | GND | Floating | WL02 | Vread | GND | WL03 | Vread | GND | WL04 | Floating |
| GSL1 | GND | Off | GSL2 | Vread | GND | GSL3 | Vread | GND | GSL4 | GND | Off |
| CSL | | | GND | | | | | | | |
| Bulk | | | — | | | | | | | |

THREE-DIMENSIONAL SEMICONDUCTOR MEMORY DEVICE WITH ACTIVE PATTERNS AND ELECTRODES ARRANGED ABOVE A SUBSTRATE

CROSS-REFERENCE TO RELATED APPLICATIONS

This application claims priority under 35 U.S.C. §119 to Korean Patent Application No. 10-2010-0014751 filed on Feb. 18, 2010, the disclosure of which is hereby incorporated by reference in its entirety.

BACKGROUND

Embodiments of the inventive concept relate generally to semiconductor memory devices. More particularly, embodiments of the inventive concept relate to three-dimensional semiconductor devices and related methods of operation.

Over the past several decades, researchers have made continual improvements to the performance, storage capacity, and cost of semiconductor memory devices. One of the primary techniques for making these improvements is increasing the integration density of the devices.

One of the most common ways to increase the integration density of a semiconductor memory device is through miniaturization. In other words, reducing the feature size of a device enables more memory cells to be formed in a unit area of a device, which can increase its speed and storage capacity, while reducing the cost per bit of storage.

Device miniaturization is limited by manufacturing technologies. For instance, to form a semiconductor memory device with high integration density, a manufacturing apparatus must be able to create fine patterns in the device. However, it is extremely expensive to improve the precision of such manufacturing apparatuses.

In an effort to improve the integration density of semiconductor memory devices despite the limits of manufacturing technology, researchers have developed three-dimensional semiconductor memory devices, which store data in a three-dimensional grid. To justify the mass production of three-dimensional semiconductor memory devices, manufacturing technologies must be able to decrease their manufacturing cost per bit compared with two-dimensional semiconductor memory devices.

SUMMARY

Embodiments of the inventive concept provide three-dimensional semiconductor devices and methods of operating the three-dimensional semiconductor memory devices. Certain embodiments provide increased data storage per unit area compared with two-dimensional semiconductor memory devices.

According to one embodiment of the inventive concept, a three-dimensional semiconductor device comprises an electrode structure comprising a plurality of electrodes arranged three-dimensionally, a plurality of active patterns penetrating the electrode structure, and information storage elements disposed between the electrode structure and the plurality of active patterns. Two electrodes positioned at opposite sides of one of the active patterns are electrically separated.

In certain embodiments, the electrode structure comprises first through m-th electrode groups each comprising a plurality of vertically stacked electrodes, the first through m-th electrode groups being arranged horizontally from the first electrode group to the m-th electrode group, where m is a natural number. The active patterns are disposed between a $(2n+1)$-th electrode group and a $(2n+2)$-th electrode group, where n is a natural number, and at least one of the electrodes in the $(2n+1)$-th electrode group is electrically separated from all of the electrodes in the $(2n+2)$-th electrode group.

In certain embodiments, the three-dimensional semiconductor device comprises a first connection region, a second connection region, and a cell array region between the first connection region and the second connection region. Electrodes in the $(2n+1)$-th electrode group and electrodes in a $(2n+3)$-th electrode group that are positioned at the same height are connected in the first connection region and are in an equipotential state, and electrodes in the $(2n+2)$-th electrode group and electrodes in a $(2n+4)$-th electrode group that are positioned at the same height are connected in the second connection region and are in an equipotential state.

In certain embodiments, the three-dimensional semiconductor device comprises a first connection region, a second connection region, and a cell array region between the first connection region and the second connection region. Electrodes in the $(2n+2)$-th electrode group and electrodes in a $(2n+3)$-th electrode group that are positioned at the same height are connected to each other in the first connection region and are in an equipotential state, and electrodes in a $(2n+4)$-th electrode group and the electrodes in a $(2n+5)$-th electrode group that are positioned at the same height are connected to each other in the second connection region and are in an equipotential state.

In certain embodiments, the three-dimensional semiconductor device comprises a first connection region, a second connection region, and a cell array region between the first connection region and the second connection region, and further comprises first interconnection lines connected to electrodes in the first connection region, and second interconnection lines connected to electrodes in the second connection region.

In certain embodiments, each of the first interconnection lines electrically connects electrodes in the $(2n+1)$-th electrode group and a $(2n+3)$-th electrode group that are positioned at the same height, and each of the second interconnection lines electrically connects electrodes in the $(2n+2)$-th electrode group and a $(2n+4)$-th electrode group that are positioned at the same height.

In certain embodiments, each of the first interconnection lines electrically connects electrodes in the $(2n+2)$-th electrode group and a $(2n+3)$-th electrode group that are positioned at the same height, and each of the second interconnection lines electrically connects electrodes in a $(2n+4)$-th electrode group and a $(2n+5)$-th electrode group that are positioned at the same height.

In certain embodiments, the semiconductor memory device further comprises bit lines that are connected to the active patterns and cross the electrodes in the cell array region, wherein the first and second interconnection lines have substantially the same material, height, or thickness as the bit lines.

In certain embodiments, the three-dimensional semiconductor device further comprises a substrate disposed below the electrode structure, and source lines disposed below the electrode structure, wherein the source lines comprise a semiconductor material having a different conductivity type compared to the substrate and the active patterns.

In certain embodiments, the electrode structure comprises first through m-th electrode groups each comprising a plurality of vertically stacked electrodes, the first through m-th electrode groups being arranged horizontally from the first electrode group to the m-th electrode group, where m is a natural number. The source lines comprise an impurity region formed in the substrate between a (2n+2)-th electrode group and a (2n+3)-th electrode group, where n is a natural number.

In certain embodiments, the three-dimensional semiconductor device further comprises semiconductor pads disposed on the active patterns, and bit lines crossing the electrodes and electrically connected to the semiconductor pads. The semiconductor pads are formed of a semiconductor material having a different conductivity type from at least one portion of the active pattern.

In certain embodiments, each of the active patterns comprises a first region and a second region that are spaced apart from each other, and the first and second regions are formed facing respective sidewalls of two adjacent electrode groups.

In certain embodiments, each of the active patterns further comprises a connection part connecting lower portions of the first and second regions.

In certain embodiments, the three-dimensional semiconductor device further comprises a substrate disposed below the electrode structure, wherein bottom surfaces of the active patterns are lower than a top surface of the substrate.

According to another embodiment of the inventive concept, a method is provided for operating a three-dimensional semiconductor device comprising an electrode structure comprising a plurality of electrodes arranged three-dimensionally, a plurality of active patterns penetrating the electrode structure, and information storage elements disposed between the electrode structure and the plurality of active patterns, wherein two electrodes positioned at opposite sides of one of the active patterns are electrically separated. The method comprises selecting a memory cell by selectively delivering an electrical signal to an intersection point between one of the electrodes and one of the active patterns.

In certain embodiments, each of the active patterns comprises a first region and a second region that are spaced apart from each other, the first region facing sidewalls of electrodes disposed at one side of the corresponding active pattern, and the second region facing sidewalls of electrodes disposed at another side of the corresponding active pattern, and wherein the electrical signal is delivered to one of the first and second regions, and blocked from the other one of the first and second regions.

In certain embodiments, the information storage elements comprise a charge storage layer, and the method further comprises injecting electrical charges into the charge storage layer at the intersection point to program the selected memory cell, and detecting data stored in the charge storage layer to read the selected memory cell.

According to another embodiment of the inventive concept, a three-dimensional semiconductor device comprises active patterns arranged two-dimensionally on a substrate, electrodes arranged three-dimensionally between the active patterns, and memory regions arranged three-dimensionally at intersecting points defined by the active patterns and the electrodes. Each of the active patterns is used as a common current path for an electrical connection to two different memory regions formed at the same height from the substrate.

In certain embodiments, two electrodes disposed on opposite sides of each of the active patterns at the same height from the substrate are electrically separated from each other.

In certain embodiments, each of the active patterns comprises a first region and a second region spaced apart from each other, and the first and second regions are formed facing sidewalls of the two electrically separated electrodes.

BRIEF DESCRIPTION OF THE DRAWINGS

The drawings illustrate selected embodiments of the inventive concept. In the drawings, like reference numbers indicate like features, and the dimensions of various features are exaggerated for clarity of illustration.

FIGS. 21 through 23 are tables for describing a method of operating a three-dimensional semiconductor device according to an embodiment of the inventive concept.

FIGS. 24 and 25 are tables for describing a method of operating a three-dimensional semiconductor device according to another embodiment of the inventive concept.

DETAILED DESCRIPTION OF THE EMBODIMENTS

Embodiments of the inventive concept are described below with reference to the accompanying drawings. These embodiments are presented as teaching examples and should not be construed to limit the scope of the inventive concept.

In the description that follows, where a feature such as a layer or film is referred to as being "on" another feature, it can be directly on the other feature, or intervening features may also be present. Although the terms first, second, third, etc., are used to describe various features, the described features are not limited by these terms. Rather, these terms are used merely to distinguish between different features.

In certain embodiments of the inventive concept, a three-dimensional semiconductor device comprises a cell array region, a peripheral circuit region, a sense amp region, a decoding circuit region, and a connection region. The cell array region comprises a plurality of memory cells, and bit lines and word lines connected to the plurality of memory cells. The peripheral circuit region comprises circuits for driving the memory cells. The sense amp region comprises circuits for reading information stored in the memory cells. The connection region is disposed between the cell array region and the decoding circuit region, and comprises an interconnection structure electrically connecting the word lines to the decoding circuit region. In some embodiments, the word lines extend from the cell array region to the connection region, and have a stepwise structure in the connection region, as will be described with reference to FIG. 6.

FIGS. 1A through 1M are perspective views illustrating a method of manufacturing an array structure of a three-dimensional semiconductor device according to an embodiment of the inventive concept.

Figure 1A:
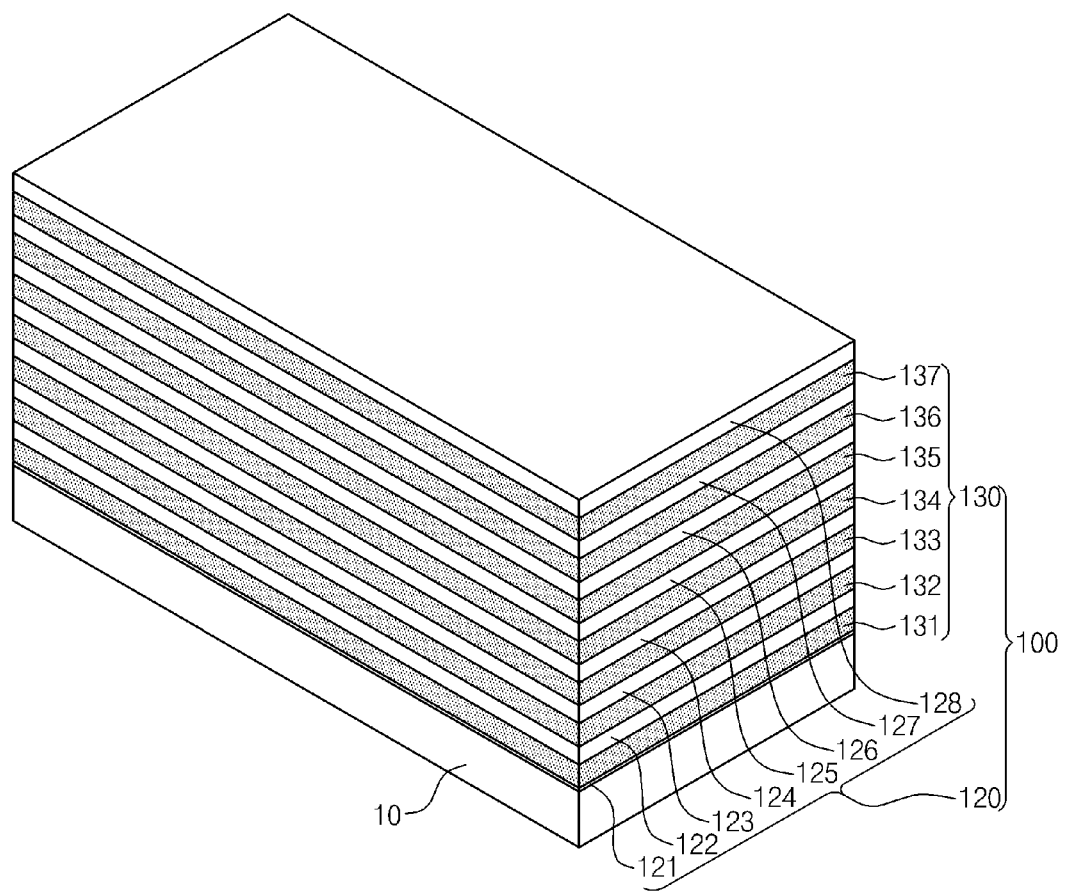
FIGS. 1A through 1M are perspective views illustrating a method of manufacturing an array structure of a three-dimensional semiconductor device according to an embodiment of the inventive concept.

Referring to FIG. 1A, a thin layer structure 100 is formed on a substrate 10. Substrate 10 typically comprises a semiconductor substrate (e.g., silicon wafer), an insulator substrate (e.g., glass), a semiconductor substrate covered with an insulating material, or a conductive substrate covered with an insulating material.

Thin layer structure 100 comprises a plurality of insulating layers 121-128 (120), and a plurality of sacrificial layers 131-137 (130). Insulating layers 120 and sacrificial layers 130 stacked in an alternating pattern as shown in the drawings. Insulating layers 120 and sacrificial layers 130 are formed of materials having an etch selectivity with respect to each other. For example, each of insulating layers 120 typically comprises at least one of a silicon oxide layer and a silicon nitride layer, and each of sacrificial layers 130 typically comprises at least one of a silicon layer, a silicon oxide layer, a silicon carbide layer, and a silicon nitride layer. Sacrificial layers 130 are generally formed of different materials from insulating layers 120.

Figure 1B:
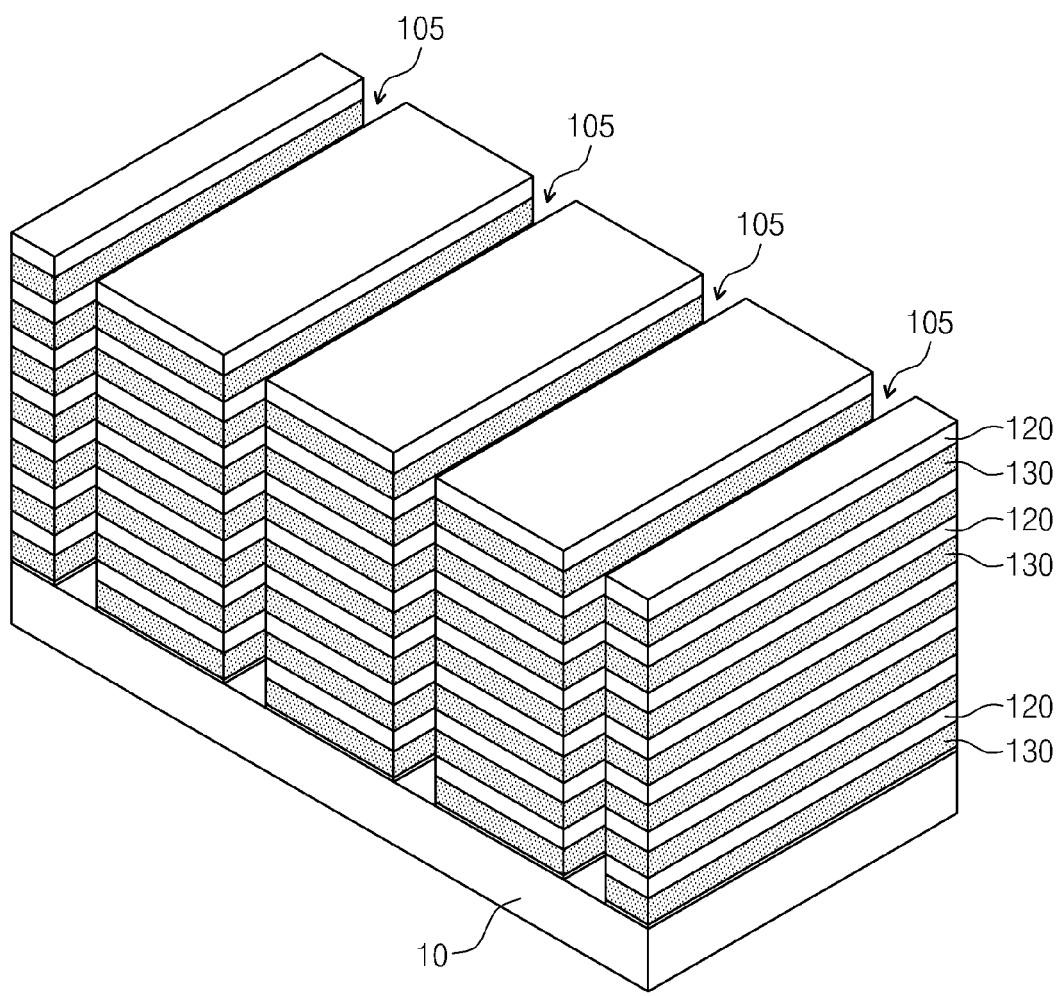
Figure 1C:
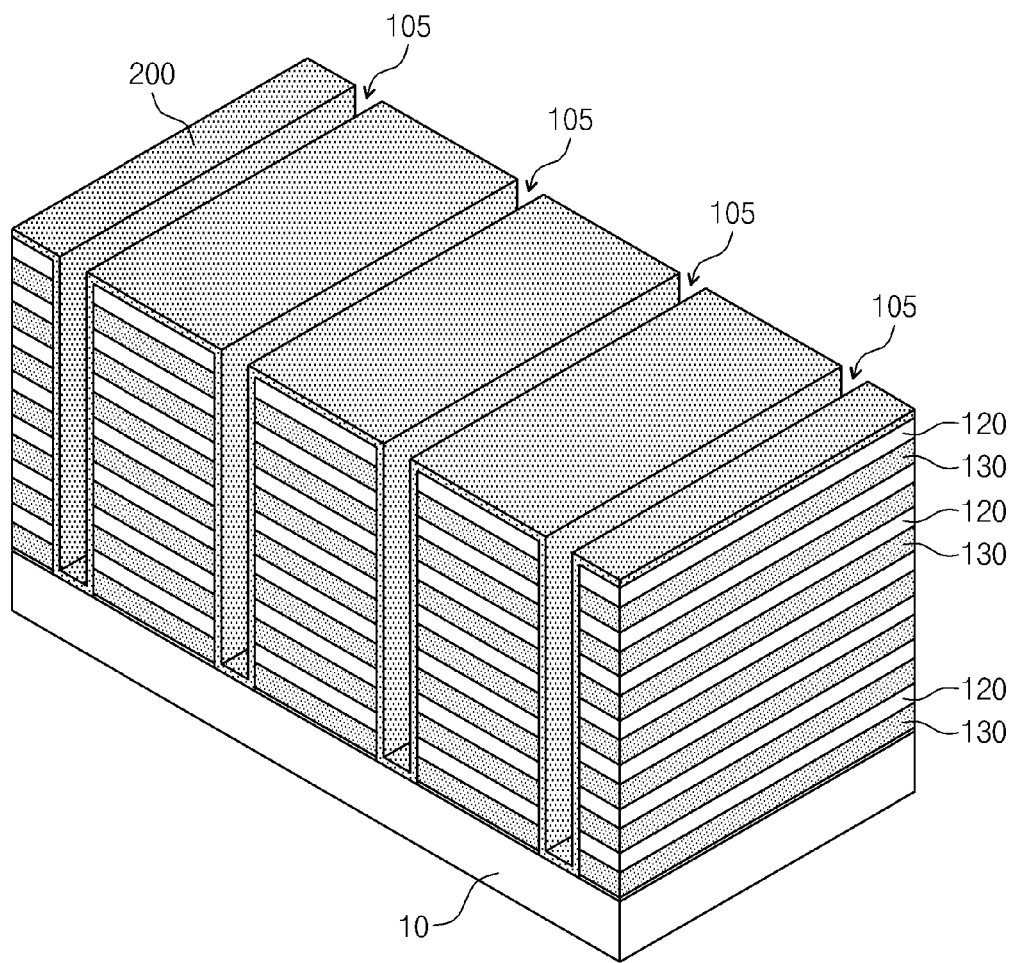

Referring to FIGS. 1B and 1C, openings 105 penetrating thin layer structure 100 are formed as shown in FIG. 1B, and then a semiconductor layer 200 covering inner walls of openings 105 is formed as shown in FIG. 1C.

Openings 105 are formed to expose a top surface of substrate 10 so that semiconductor layer 200 can be formed in direct contact with the top surface of substrate 10. Openings 105 are formed across thin layer structure 100 in the cell array region. Consequently, thin layer structure 100 is separated into a plurality of portions in the cell array region.

In some embodiments, semiconductor layer 200 comprises a polycrystalline semiconductor layer (e.g., polysilicon layer) formed by chemical vapor deposition (CVD). Semiconductor layer 200 is formed to conformably or conformally cover the inner walls of openings 105. In some embodiments, semiconductor layer 200 is formed so as not to completely fill openings 105, as shown in FIG. 1C.

In other embodiments, semiconductor layer 200 comprises a layer of semiconductor material formed by an epitaxial growth technique or a chemical vapor deposition technique, and has a polycrystalline structure, a single crystalline structure, or an amorphous structure.

Figure 1D:
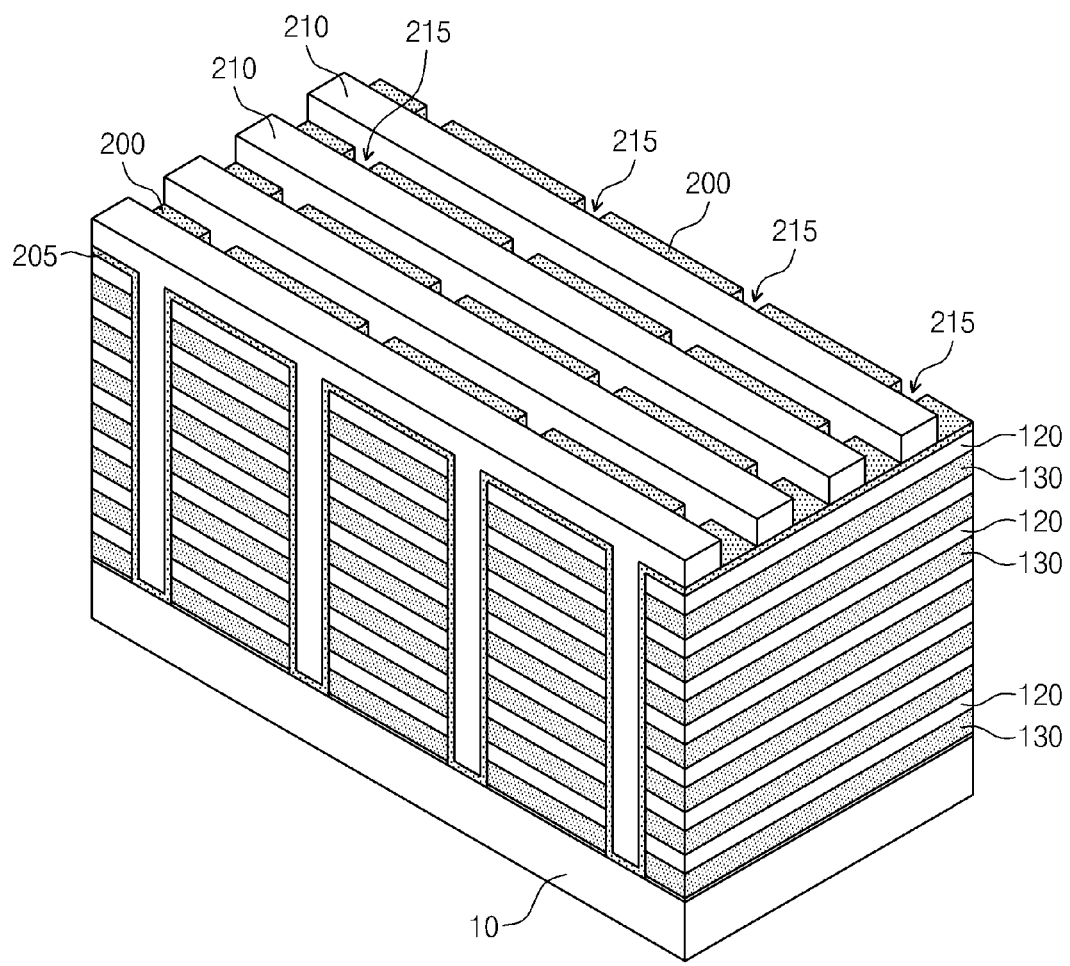

Referring to FIG. 1D, first buried patterns 210 are formed in openings 105 covered by semiconductor layer 200. In each opening 105, multiple first buried patterns 210 are spaced apart horizontally from one another. Accordingly, in one opening 105, a plurality of separation holes 215 are formed between first buried patterns 210 to expose a surface of semiconductor layer 200. In some embodiments, first buried patterns 210 extend upward from thin layer structure 100 and are connected to one another. In such embodiments, as shown in FIG. 1D, first buried patterns 210 are formed across openings 105.

The forming of first buried patterns 210 comprises forming a first buried layer filling openings 105, and then patterning the first buried layer. The patterning of the first buried layer comprises anisotropically etching the first buried layer using etch mask patterns crossing openings 105. The etching of the first buried layer can be performed using an etchant having an etch selectivity with respect to semiconductor layer 200.

First buried patterns 210 are formed of at least one insulating material. For example, first buried patterns 210 can be formed of insulating materials formed of silicon on glass (SOG) or silicon oxide. In some embodiments, prior to or during the formation of first buried patterns 210, hydrogen annealing is further performed in a hydrogen atmosphere to treat the resultant substrate having semiconductor layer 200 formed thereon. This hydrogen annealing can cure crystal defects in semiconductor layer 200.

Figure 1E:
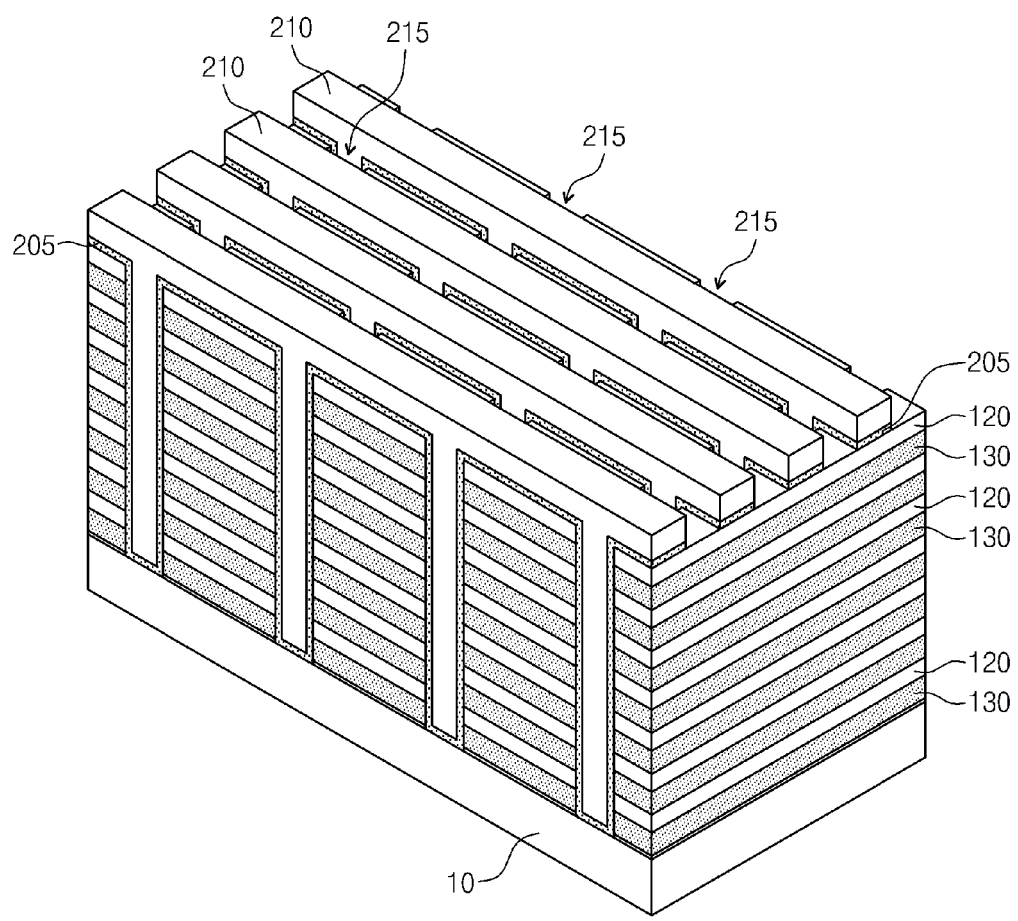

Referring to FIG. 1E, semiconductor layer 200 exposed through separation holes 215 is etched to form semiconductor patterns 205 separated from one another in opening 105. In certain embodiments, semiconductor patterns 205 cross openings 105 while conformably or conformally covering the inner walls of openings 105 and the top surface of thin layer structure 100.

The forming of semiconductor patterns 205 comprises etching a surface of the exposed semiconductor layer 200 using first buried patterns 210 as an etch mask. This etching can be performed through an isotropic etching process or anisotropic etching process, using an etchant having an etch selectivity with respect to thin layers 120, 130 constituting thin layer structure 100, and first buried pattern 210. Through the etching, a width of semiconductor pattern 205 can become smaller than a width of first buried pattern 210 overlying semiconductor pattern 205.

Figure 1F:
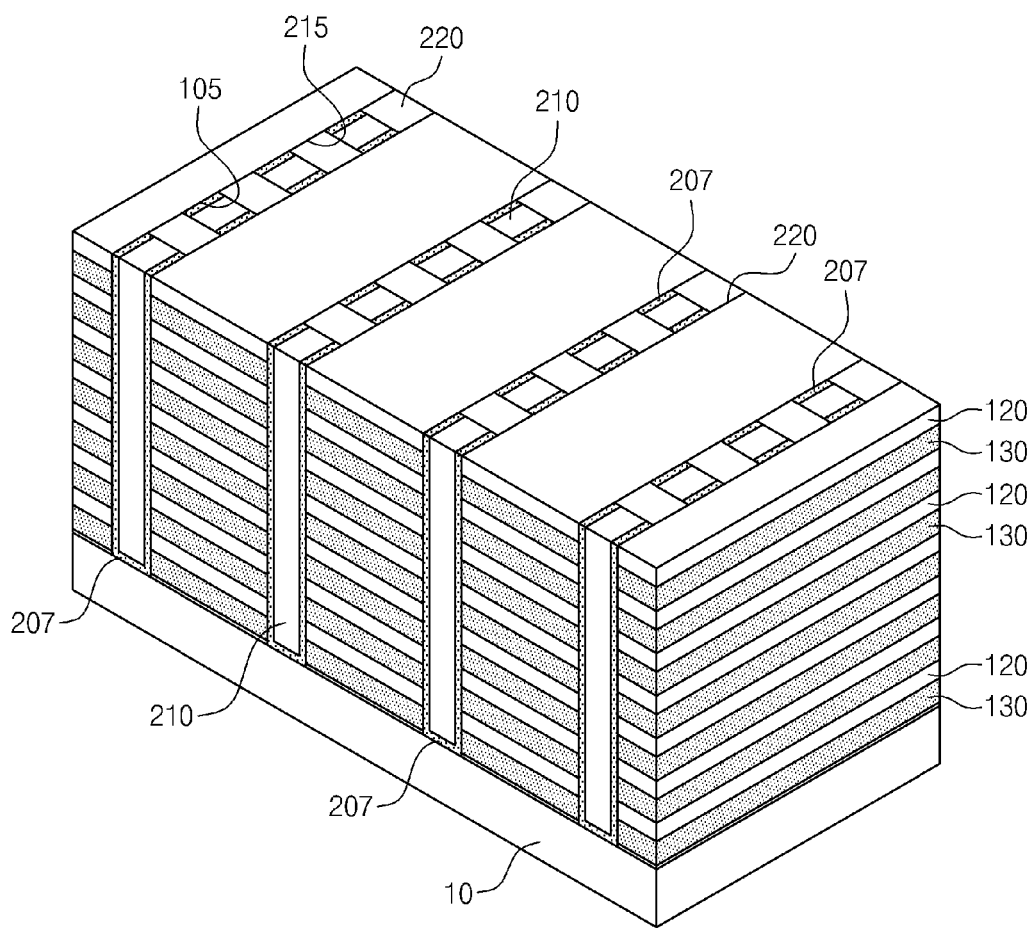

Referring to FIG. 1F, a second buried layer is formed to fill separation holes 215, and then the second buried layer and semiconductor patterns 205 are planarization-etched until a top surface of thin layer structure 100 is exposed. Each of semiconductor patterns 205 is separated into a plurality of active patterns 207 disposed in different openings 105, and the second buried layer forms second buried patterns 220 filling separation holes 215 between first buried patterns 210. Accordingly, active patterns 207, first buried patterns 210, and second buried patterns 220 are arranged on substrate 10 two-dimensionally while penetrating thin layer structure 100. In certain embodiments, second buried patterns 220 are formed of insulating materials.

Figure 1G:
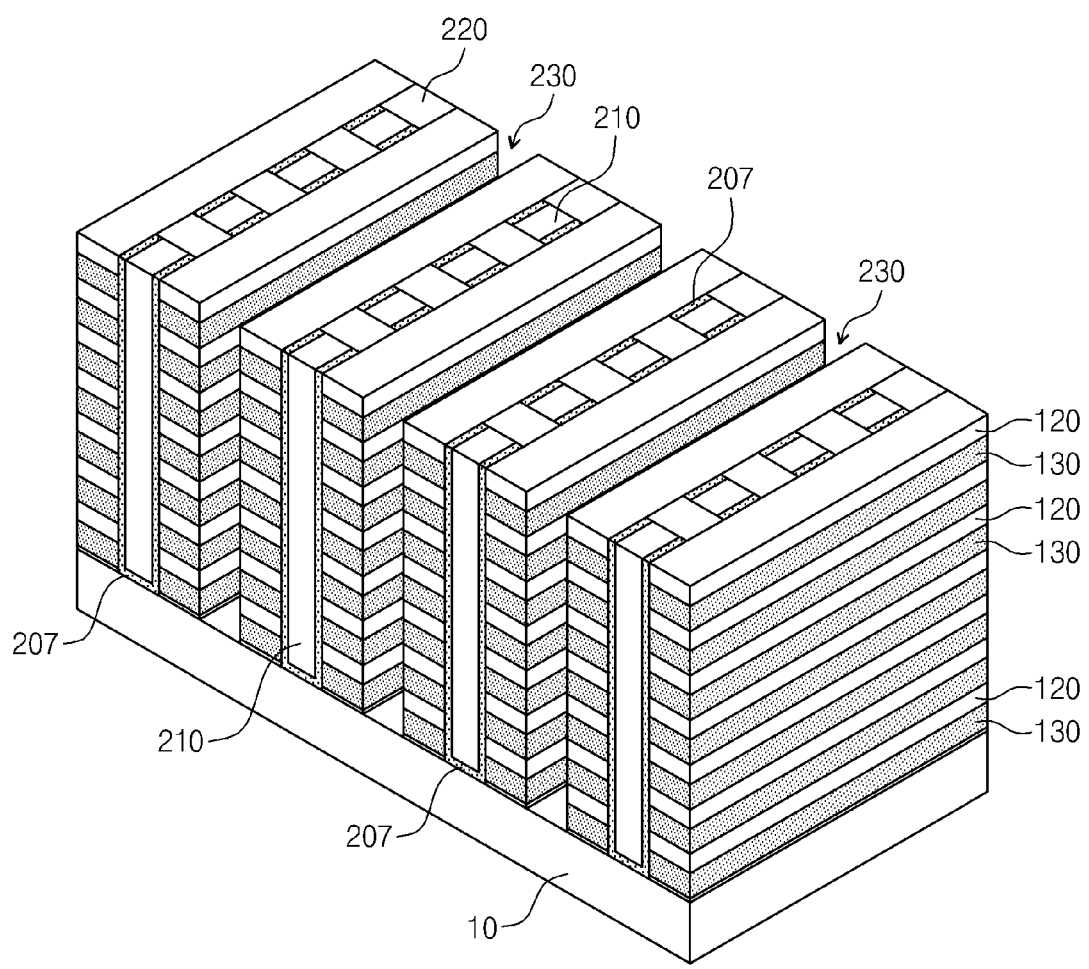
Figure 1H:
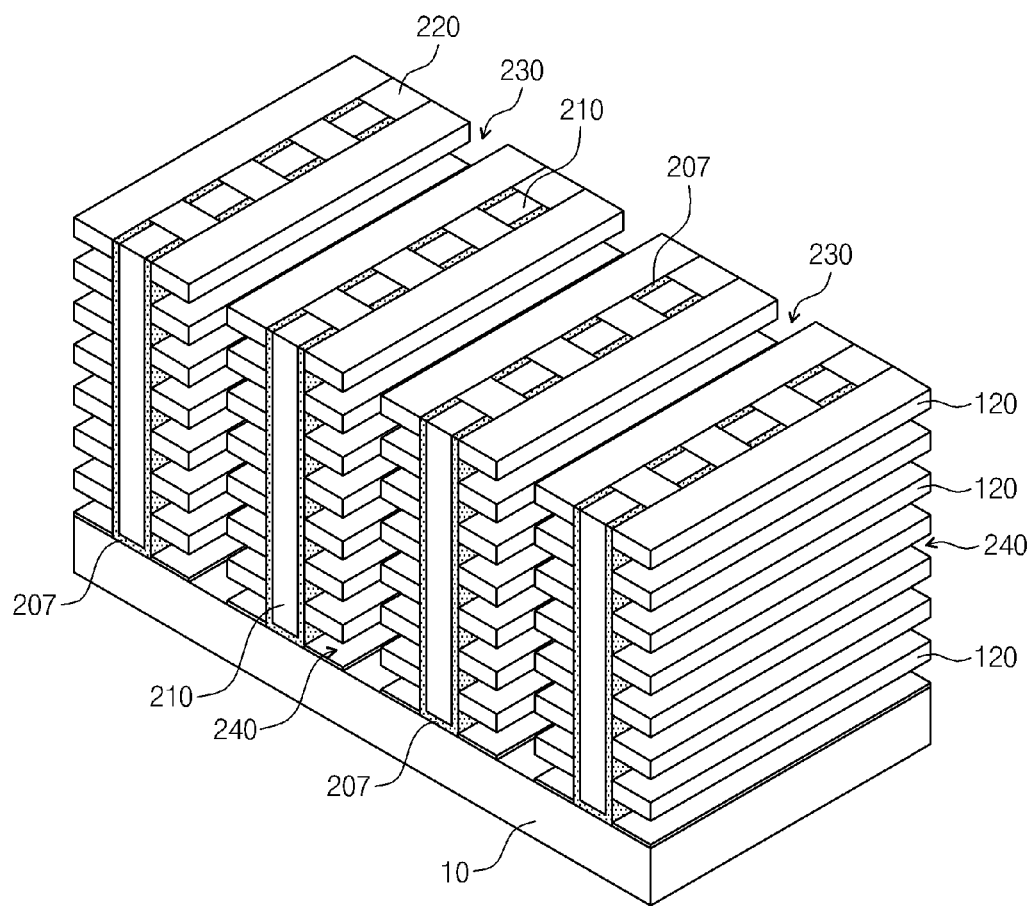
Figure 1I:
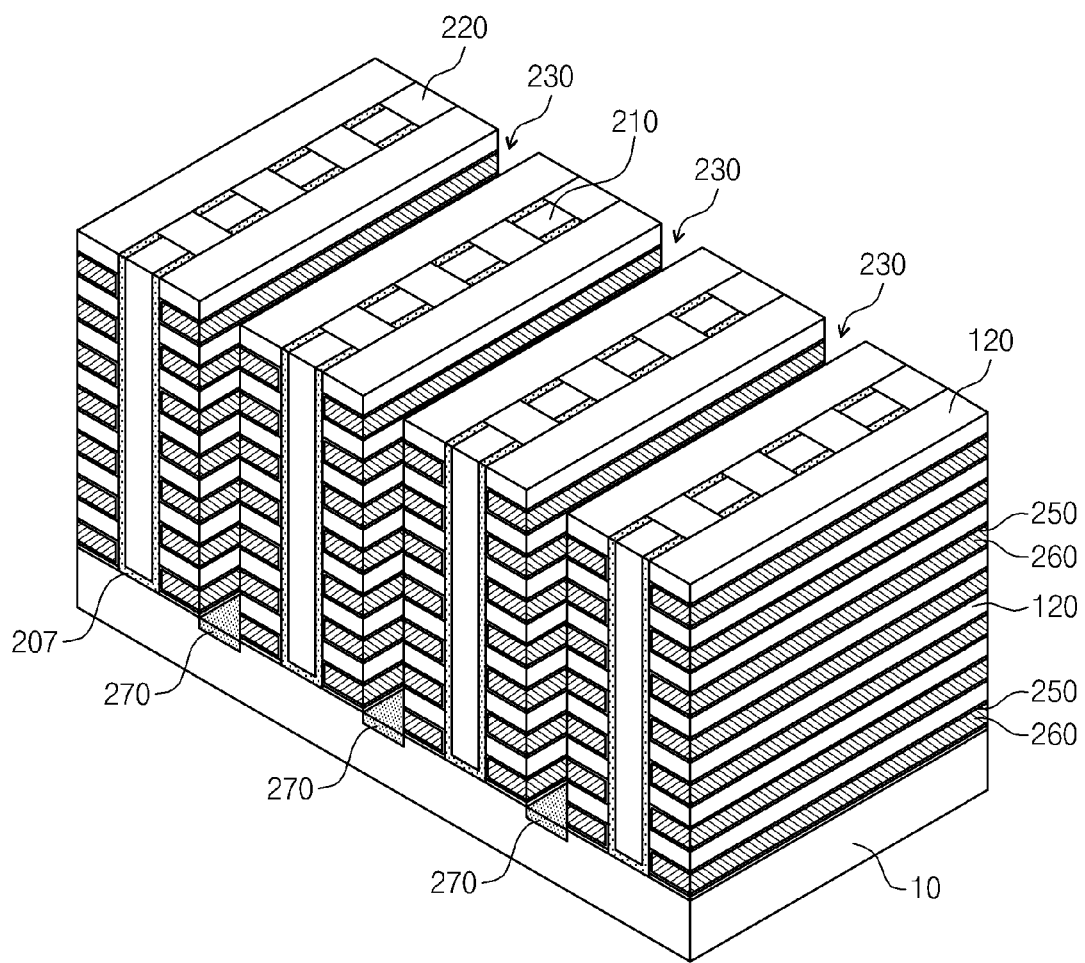

Referring to FIGS. 1G through 1I, a horizontal interconnection line forming process is performed to create conductive patterns 260, which are sequentially stacked and face sidewalls of active patterns 207. The horizontal interconnection line forming process comprises forming trenches 230 penetrating some or all of the thin layers constituting thin layer structure 100 between active patterns 207, and then replacing sacrificial layers 130 with conductive material layers.

As shown in FIG. 1G, trenches 230 are formed apart from active patterns 207 to expose the sidewalls of sacrificial layers 130 and sidewalls of insulating layers 120. Trenches 230 are formed across thin layer structure 100 in the cell array region. Accordingly, between one pair of adjacent active patterns 207, thin layer structure 100 is separated into two portions by trench 230. In a vertical direction, trenches 230 are formed so as to expose a top surface of the lowermost sacrificial layer among sacrificial layers 130.

The replacing of sacrificial layers 130 comprises selectively removing sacrificial layers 130, the sidewalls of which are exposed by trenches 230, to form recess regions 240 between insulating layers 120, as shown in FIG. 1H, and forming an information storage element 250 and a conductive pattern 260 in each of recess regions 240 as shown in FIG. 1I.

Recess regions 240 are gap regions extending horizontally between insulating layers 120 from trench 230, and are formed to expose the sidewalls of active patterns 207. The forming of recess regions 240 comprises isotropically etching sacrificial layers 130 using an etchant having an etch selectivity with respect to insulating layers 120. For example, where sacrificial layers 130 are silicon nitride layers, and insulating layers 120 are silicon oxide layers, the etching can be performed by using an etchant comprising phosphoric acid.

The forming of information storage element 250 and conductive pattern 260 comprises forming information storage element 250 and a conductive layer sequentially covering trenches 230 and recess regions 240, and then removing the conductive layer in trenches 230 such that conductive patterns 260 are left in recess regions 240.

Information storage element 250 can be formed by using a deposition technique (e.g., chemical vapor deposition or atomic layer deposition) capable of providing superior step coverage, and can be formed with a thickness that is smaller than half of a thickness of each of recess regions 240. Therefore, information storage element 250 can be formed to substantially conformably or conformally cover the resulting thin layer structure having recess regions 240.

Information storage element 250 typically comprises a charge storage layer. For instance, information storage element 250 can comprise an insulating layer comprising a trap insulating layer, a floating gate electrode, or conductive nano dots. In some embodiments, information storage element 250 further comprises a tunnel insulating layer and a blocking insulating layer. The tunnel insulating layer comprises at least one of a silicon oxide layer and a silicon nitride layer, and the blocking insulating layer comprises at least one of an aluminum oxide layer, a silicon oxide layer, and a silicon nitride layer.

The conductive layer can be formed to fill recess regions 240 covered by information storage element 250. Moreover, trenches 230 can be completely or partially filled by the conductive layer. The conductive layer typically comprises at least one of doped silicon, tungsten, metal nitrides, and metal silicides.

Conductive patterns 260 are formed through a process (hereafter, a "replacement process") of filling recess regions 240 formed by removing sacrificial layers 130. This replacement process makes it possible to vary the types of materials used to form conductive patterns 260. Where the replacement process is not performed, it may be difficult to form conductive patterns 260 of a metal material. For example, where a plurality of metal layers and a plurality of insulating layers are alternatingly stacked, it may be difficult to form openings penetrating the metal layers and the insulating layers in a desired shape.

The removing of the conductive layer in trench 230 comprises anisotropically etching the conductive layer using the uppermost insulating layer 120 of thin layer structure 100 or a hard mask pattern (not shown) additively formed on the uppermost insulating layer as an etch mask. After the conductive layer in trench 230 is removed, the conductive layer forms vertically separated conductive patterns 260 in recess regions 240. The conductive layer can alternatively be formed to conformably or conformally cover an inner wall of trench 230, and the removing of the conductive layer in trench 230 can be performed by isotropic etching.

In some embodiments, impurity regions 270 are formed after conductive patterns 260. Impurity regions 270 can be formed through an ion implantation process, and can be formed in substrate 10 exposed through trench 230. Like trenches 230, impurity regions 270 may be formed across thin layer structure 100 in the cell array region.

In some embodiments, impurity regions 270 are connected to one another, and thus they have an equipotential state. In other embodiments, impurity regions 270 are electrically separated such that they have different potentials. In still other embodiments, impurity regions 270 form a plurality of independent source groups comprising a plurality of different impurity regions, and the source groups are electrically separated such that the source groups have different potentials.

Figure 1J:
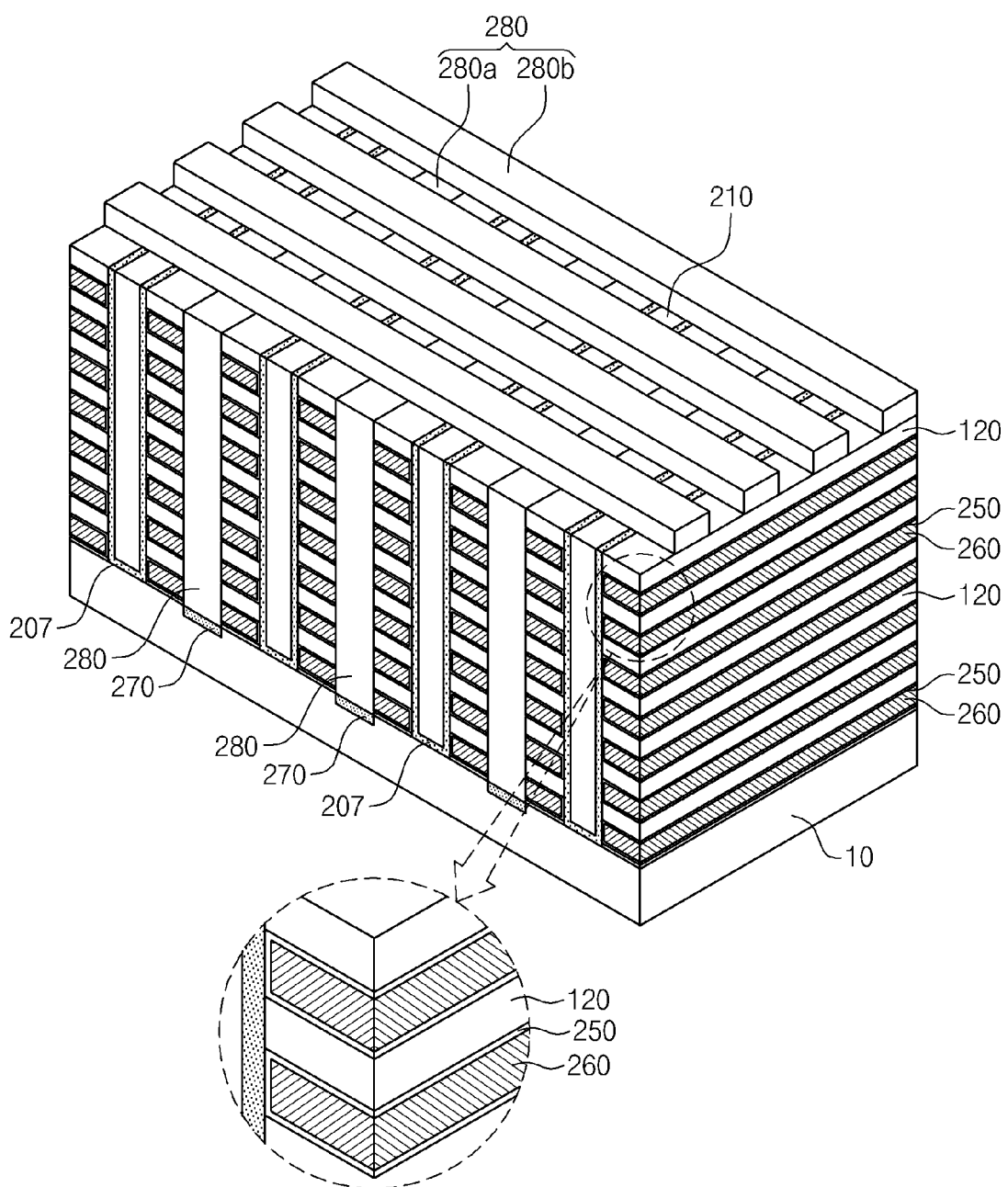

Referring to FIG. 1J, an electrode separation pattern 280 filling trench 230 is formed. The forming of electrode separation pattern 280 comprises forming an electrode separation layer on the thin layer structure having impurity regions 270, and then etching the electrode separation layer. Electrode separation pattern 280 is formed to fill trench 230, and can be formed of at least one of a silicon oxide layer, a silicon nitride layer and a silicon oxynitride layer.

Electrode separation pattern 280 is formed with buried portion 280a filling trench 230, and a mold portion 280b exposing top surfaces of active patterns 207. Mold portion 280b extends from an upper region of buried portion 280a to cross conductive patterns 260, as shown in FIG. 1J.

Active pattern 207 exposed through electrode separation patterns 280 is doped with impurities to form an upper impurity region (not shown). The impurities of the upper impurity region have a conductivity type that is different from that of active pattern 207. Thus, active pattern 207 and the upper impurity region form a diode. A bottom surface of the upper impurity region is formed at a higher level than a top surface of the uppermost conductive pattern among conductive patterns 260.

Figure 1K:
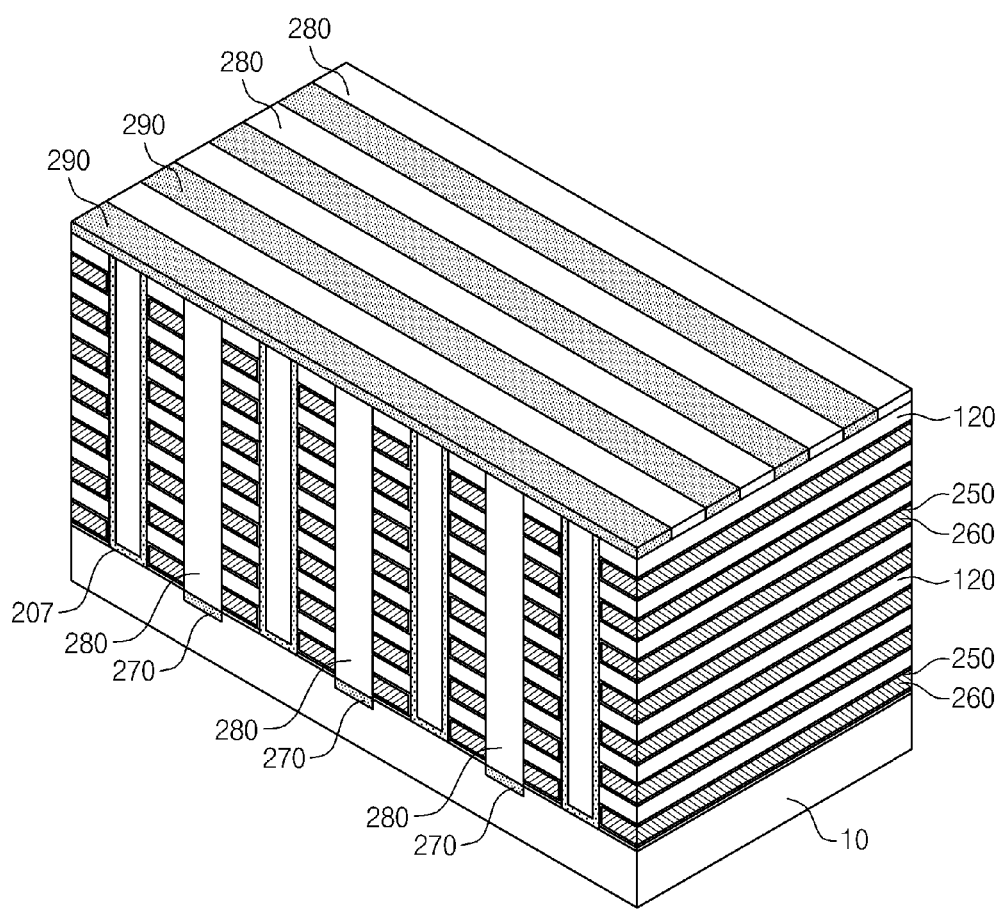

Referring to FIG. 1K, pad patterns 290 contacting the top surfaces of the exposed active patterns 207 are formed. The forming of pad patterns 290 comprises forming a thin layer covering active patterns 207 exposed by electrode separation patterns 280 and planarization-etching the thin layer until a top surface of electrode separation pattern 280 is exposed. In other words, pad patterns 290 are formed through a damascene process using electrode separation patterns 280 as a mold. In other embodiments, pad patterns 290 are formed through a conventional patterning process in which a thin layer deposition operation and a photolithography/etching operation are performed in sequence.

Pad patterns 290 are formed of a material having a different conductivity type from active patterns 207. For example, where active patterns 207 comprise p-type silicon, pad patterns 290 can comprise n-type polycrystalline silicon. Meanwhile, after the upper impurity regions are formed, pad patterns 290 can be formed of a conductive material providing an ohmic contact characteristic between pad patterns 290 and the upper impurity regions.

Figure 1L:
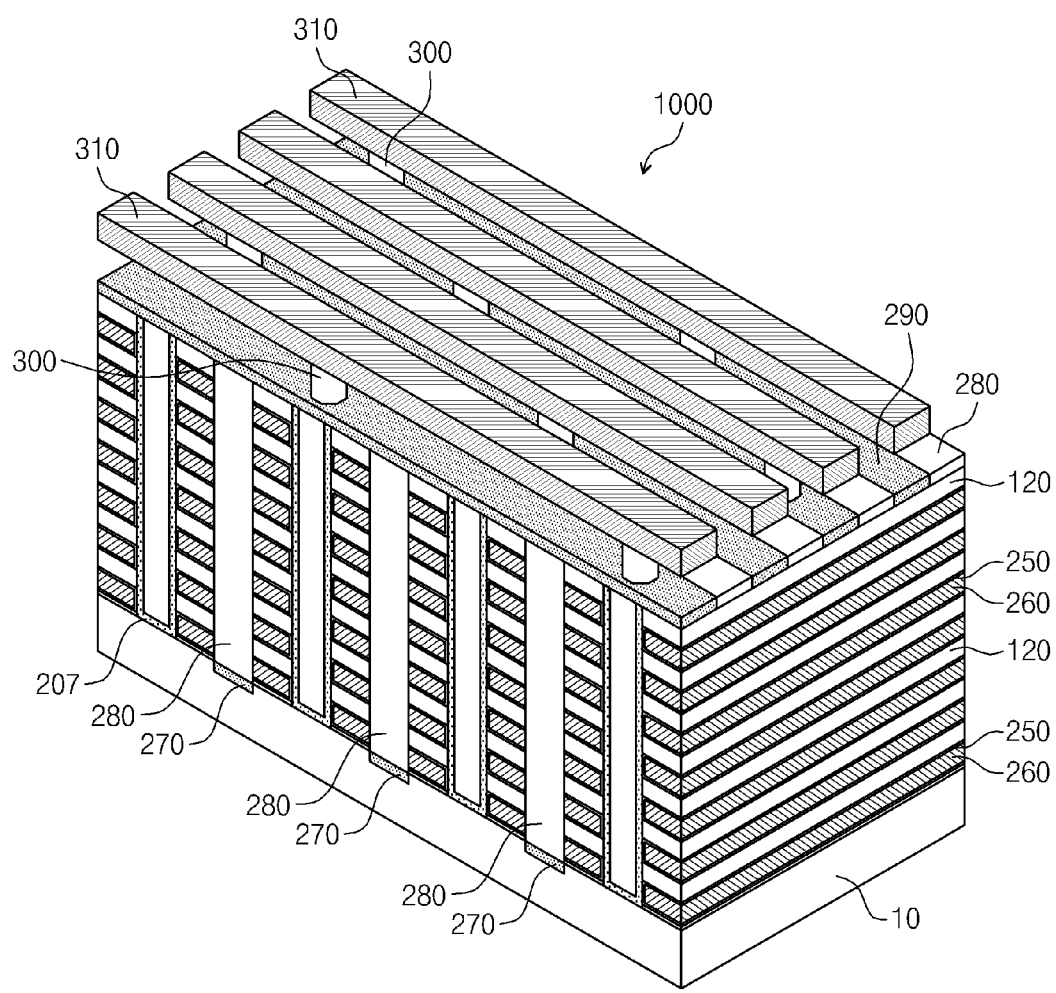

Referring to FIG. 1L, plugs 300 connected to pad patterns 290, and upper interconnection lines 310 connected to plugs 300 are formed. Each of upper interconnection lines 310 is electrically connected to active patterns 207 through one of plugs 300 and one of pad patterns 290. In an embodiment comprising a NAND flash memory, upper interconnection lines 310 are used as bit lines connected to a plurality of cell strings.

Where pad patterns 290 are formed across conductive patterns 260, pad patterns 290 can be used as bit lines for a flash memory. Accordingly, upper interconnection lines 310 may be unnecessary. However, the shape and layout of pad patterns 290 can be modified variously, and upper interconnection lines 310 can be still used as bit lines for a NAND flash memory. Modified embodiments related to the shape and layout of pad patterns 290 will be described in further detail with reference to FIGS. 5A and 5B.

Figure 1M:
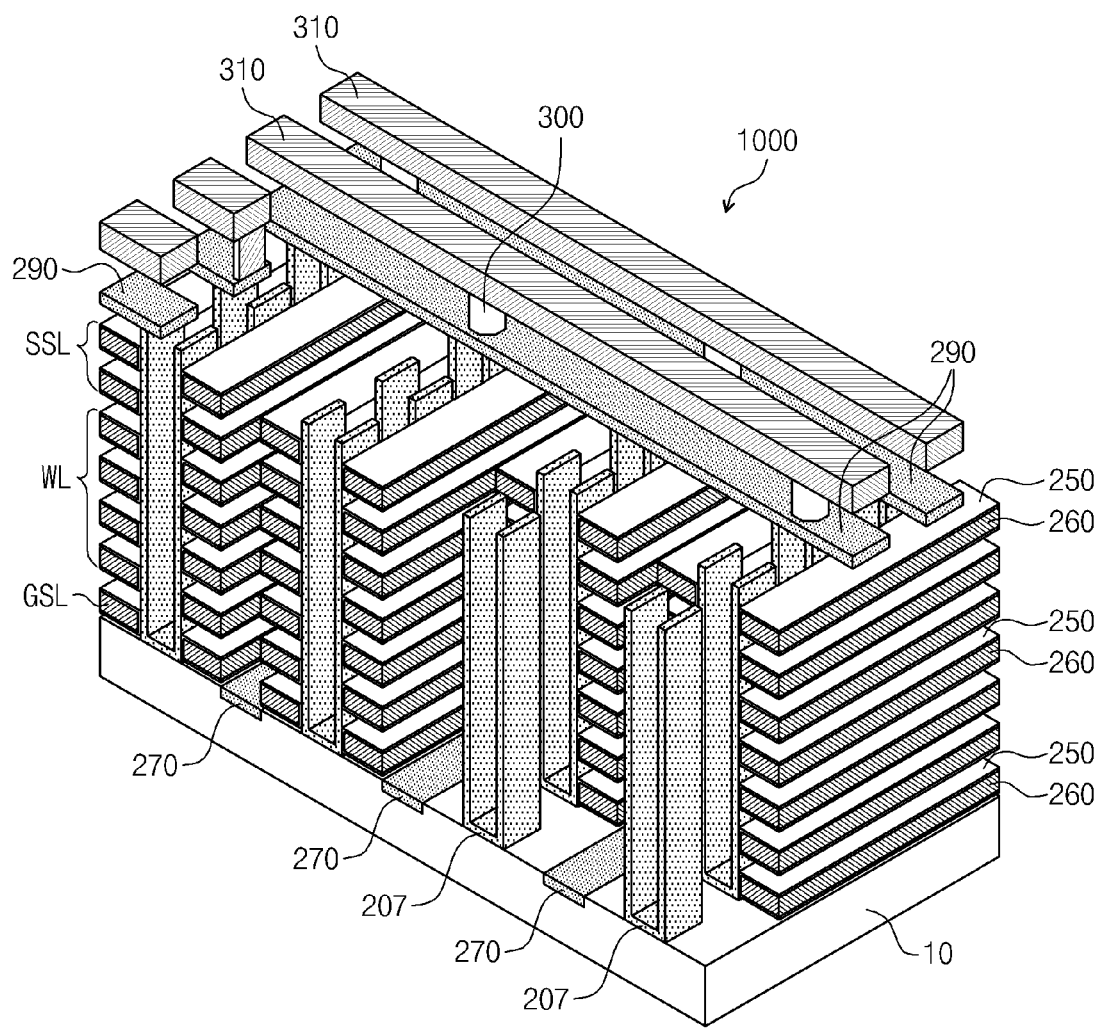

FIG. 1M is a perspective view illustrating an array structure 1000 of the three-dimensional semiconductor device of FIGS. 1A through 1L. FIG. 1M is substantially the same as FIG. 1L, except that first and second buried patterns 210, 220 and insulating layers 120 are not shown in FIG. 1M.

Referring to FIG. 1M, each of active patterns 207 comprises a bottom portion contacting the top surface of substrate 10, and extending portions extending upward from the bottom portion and facing sidewalls of conductive patterns 260. Except for the connection through the bottom portion, the extending portions are separated from one another. Therefore, each of active patterns 207 is formed to have a "U" shape.

In an embodiment comprising a three-dimensional NAND flash memory, stacked conductive patterns 260 are used as a string selection line SSL, a ground selection line GSL, and word lines WL. More specifically, the lowermost layer and the uppermost layer of conductive patterns 260 are used as string selection line SSL and ground selection line GSL, respectively, and conductive patterns 260 between the lowermost layer and the uppermost layer are used as word lines WL. Alternatively, conductive patterns 260 corresponding to the uppermost two layers can be used as string selection line SSL.

Conductive patterns 260 used as string selection line SSL are separated from one another. Conductive patterns 260 used as word lines WL form a plurality of word line groups, where conductive patterns 260 in each word line group are electrically or physically connected to one another. Various embodiments related to connection of such word lines will be described with reference to FIGS. 6 through 19.

Figure 2A:
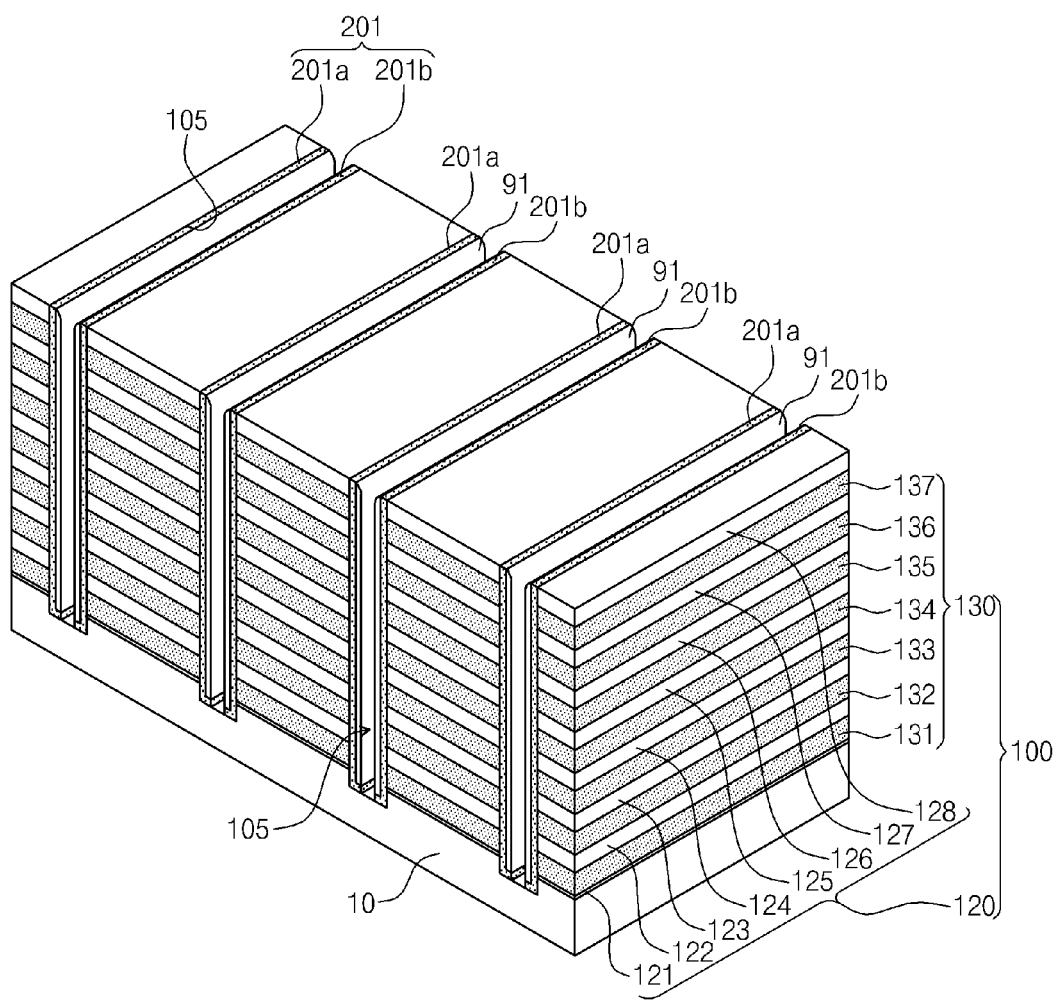
FIGS. 2A and 2B are perspective views illustrating a method of manufacturing an array structure of a three-dimensional semiconductor device according to another embodiment of the inventive concept.
Figure 2B:
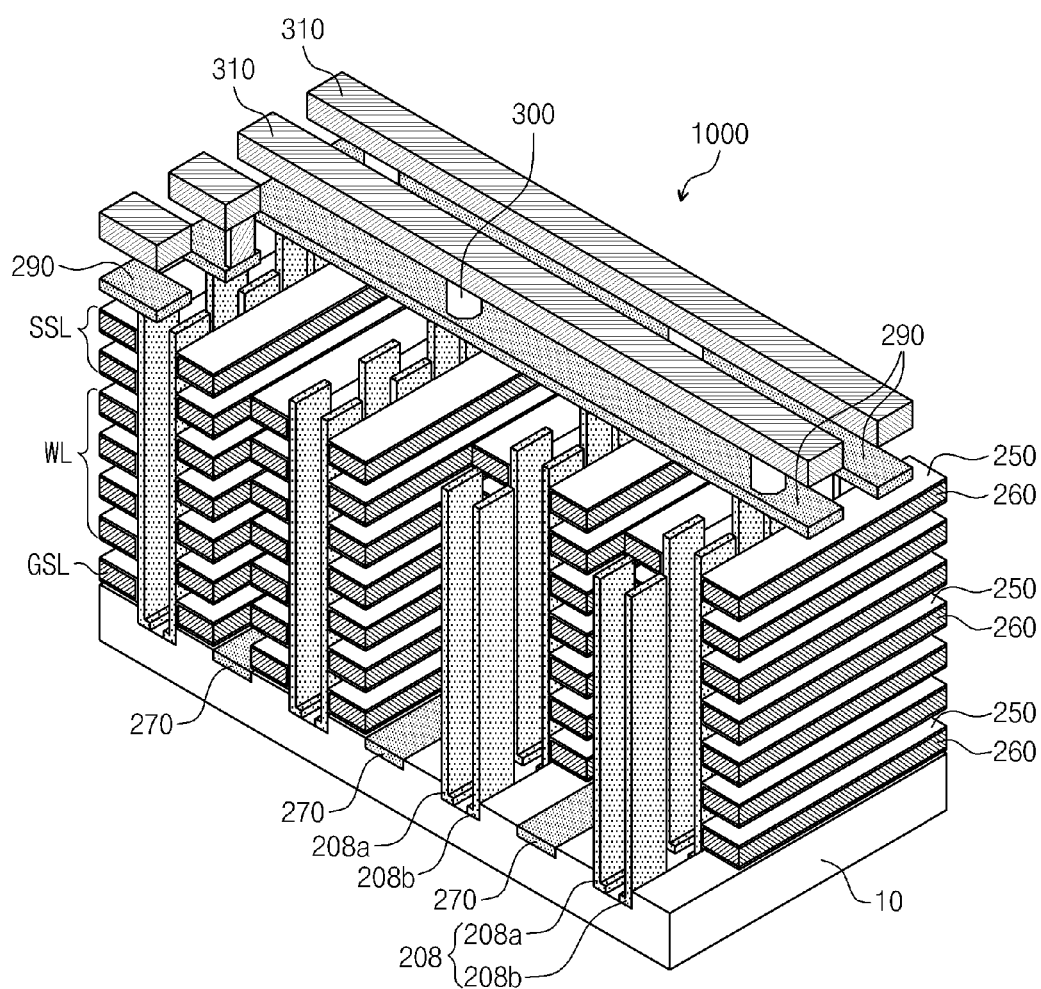

FIGS. 2A and 2B are perspective views illustrating a method of manufacturing an array structure of a three-dimensional semiconductor device according to an embodiment of the inventive concept. The embodiment of FIGS. 2A and 2B is similar to the embodiment of FIG. 1, except for differences in shape and layout of active pattern 207 and in the method of forming active pattern 207. Accordingly, to avoid redundancy, a further description will not be provided for features already described with reference to FIG. 1.

Referring to FIG. 2A, semiconductor layer 200 is patterned to form sidewall semiconductor patterns 201 exposing a bottom surface of opening 105. Sidewall semiconductor patterns 201 comprise a first semiconductor pattern 201a covering one sidewall of opening 105, and a second semiconductor pattern 210b covering the other sidewall of opening 105. First and second semiconductor patterns 210a, 210b are separated spatially from each other.

The patterning of semiconductor layer 200 comprises an etching operation of performing etching using spacers 91 covering sidewalls of semiconductor layer 200 in openings 105 as an etch mask. Spacers 91 comprise an insulating material having an etch selectivity with respect to semiconductor layer 200, as shown in FIG. 2A. In the patterning of semiconductor layer 200, semiconductor layer 200 is removed from an upper portion of the thin layer structure so that a top surface of insulating layer 120 is exposed.

Thereafter, fabrication processes described with reference to FIGS. 1D through 1L are performed with respect to the resultant thin layer structure 100 having first and second semiconductor patterns 201a, 201b formed therein. As resultant elements, first semiconductor pattern 201a and second semiconductor pattern 201b become a first active pattern 208a and a second active pattern 208b, which are spatially separated from each other by first buried pattern 210, as shown in FIG. 2B. First and second active patterns 208a, 208b constitute an active pattern 208 in the embodiment of FIGS. 2A and 2B.

As shown in FIGS. 2A and 2B, opening 105 is formed with a bottom surface at a lower level than the top surface of substrate 10. Accordingly, bottom surfaces of first and second active patterns 208a, 208b, and a bottom surface of first buried pattern 210 are at a lower level than the top surface of substrate 10. In this configuration, a contact area between first and second active patterns 208a, 208b and substrate 10 is increased.

Figure 3A:
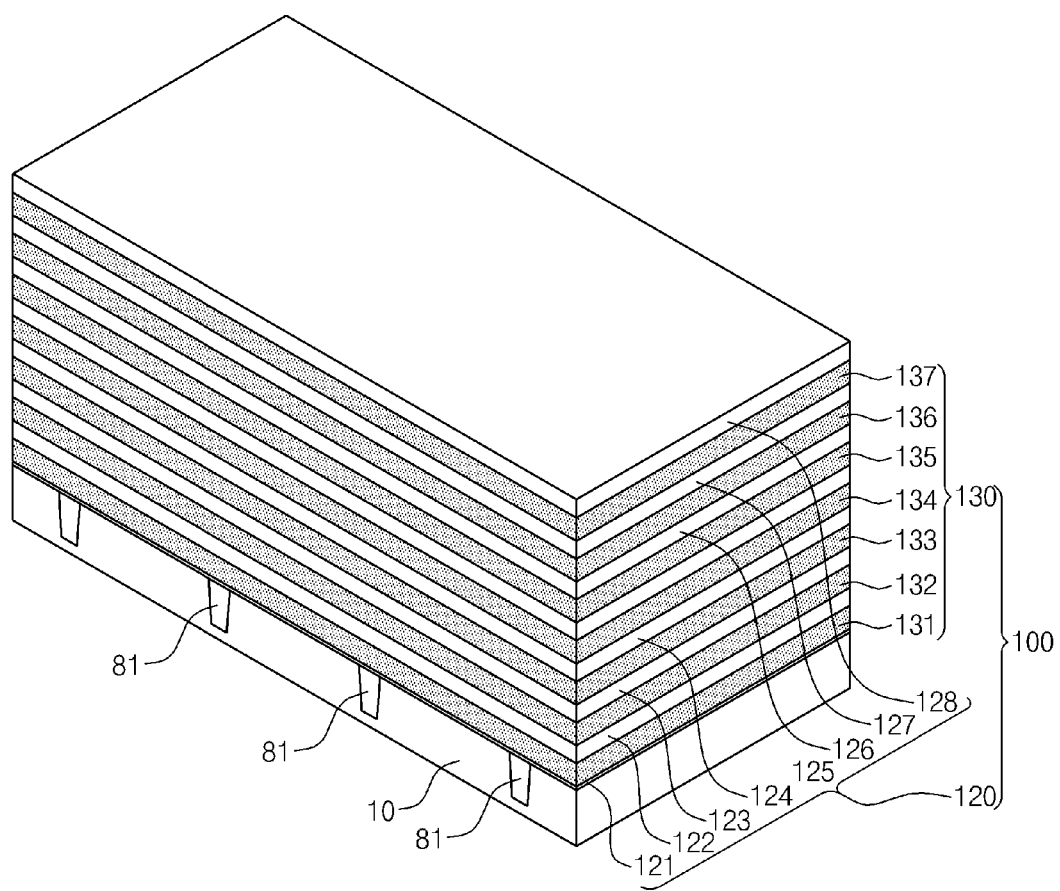
FIGS. 3A through 3D are perspective views illustrating a method of manufacturing an array structure of a three-dimensional semiconductor device according to other embodiments of the inventive concept.
Figure 3B:
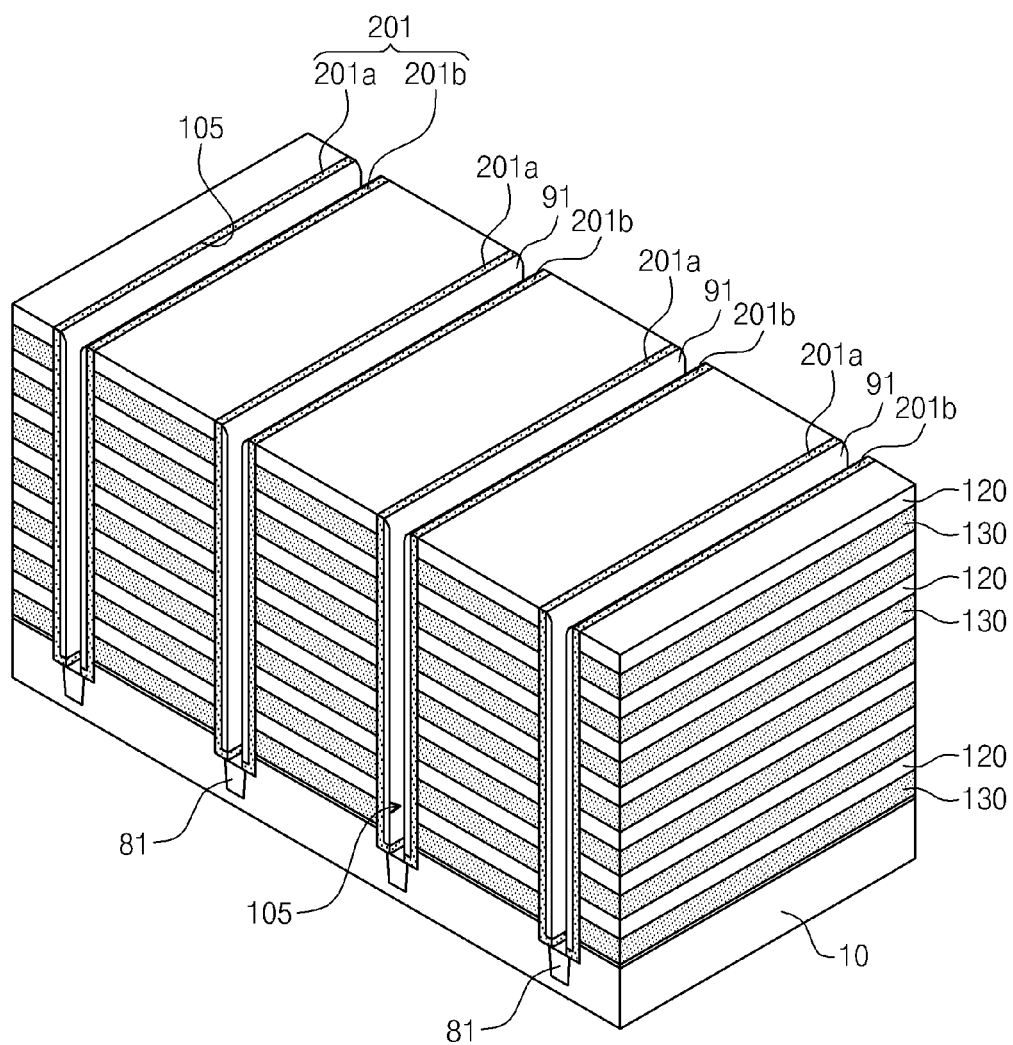
Figure 3C:
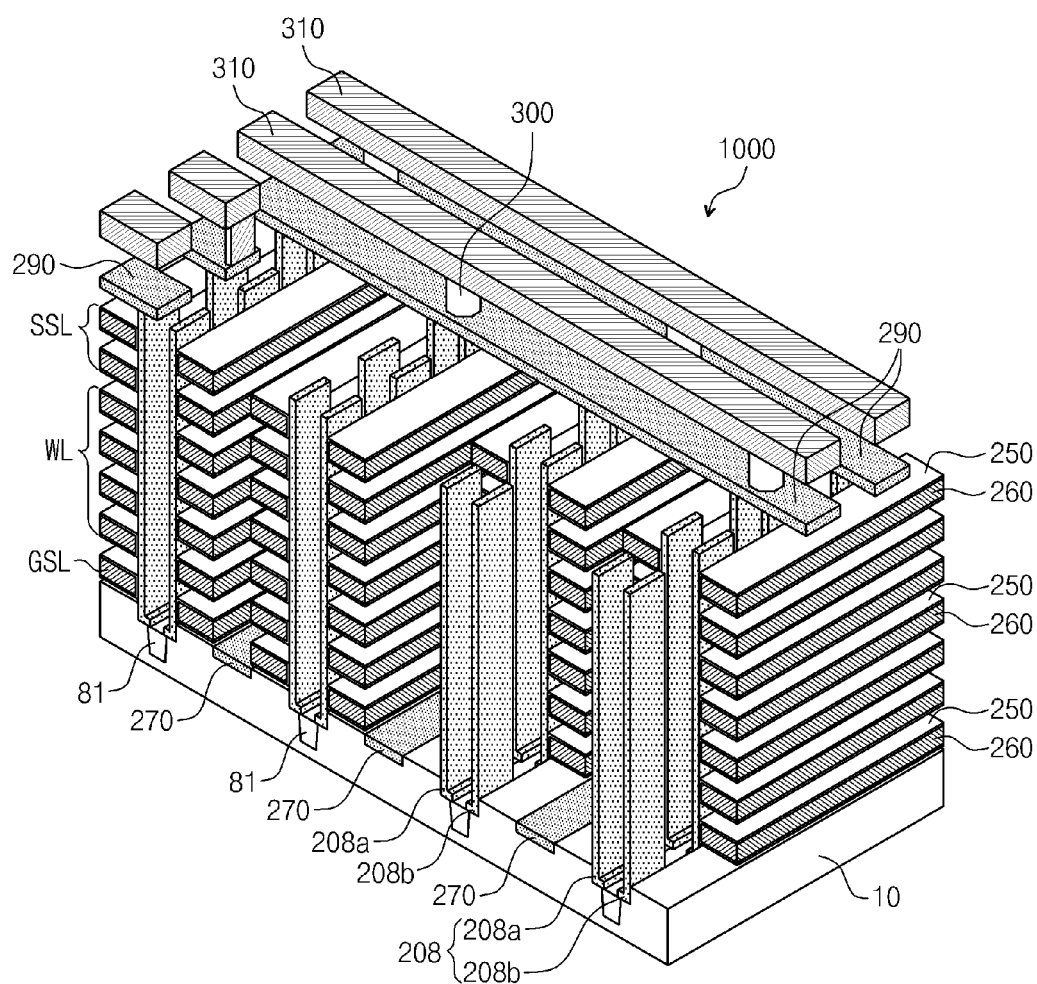
Figure 3D:
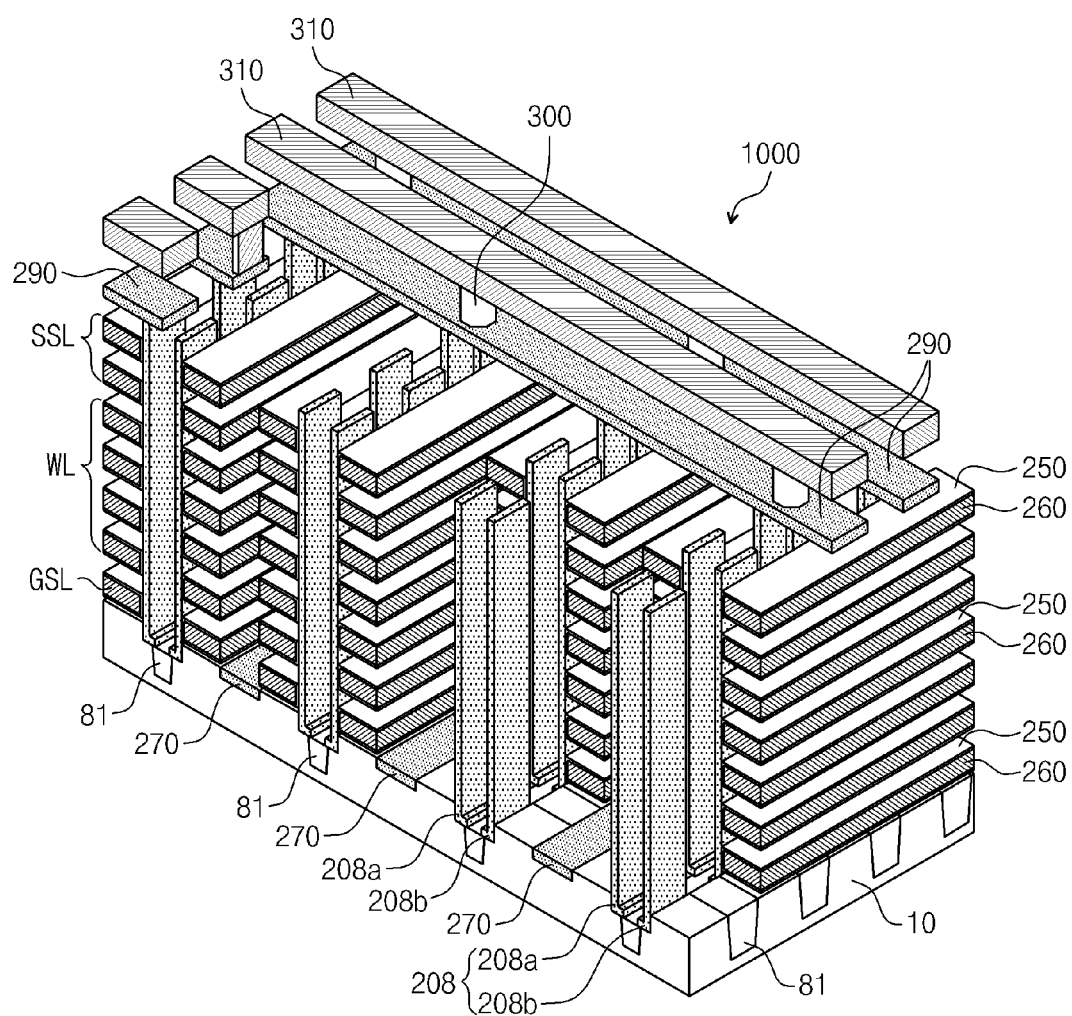

FIGS. 3A through 3C are perspective views illustrating a method of manufacturing an array structure of a three-dimensional semiconductor device according to an embodiment of the inventive concept. FIG. 3D is a perspective view of an array structure of a three-dimensional semiconductor device according to still another embodiment of the inventive concept. The embodiments of FIGS. 3A through 3D are similar to the embodiment of FIGS. 2A and 2B, except for modifications related to a device isolation pattern 81 shown in FIGS. 3A through 3D. Accordingly, to avoid redundancy, a further description will not be provided for features already described with reference to FIGS. 2A and 2B.

Referring to FIG. 3A, prior to forming thin layer structure 100, a device isolation pattern 81 is formed in a predetermined region of substrate 10. Device isolation patterns 81 are formed in regions where openings 105 are being formed.

Device isolation patterns 81 are typically formed using a device isolation process for defining active regions in a peripheral circuit region, etc. For instance, in some embodiments, device isolation patterns 81 are formed using a shallow trench isolation (STI) process. In other embodiments, device isolation patterns 81 are formed through a manufacturing process that is independent from STI processes performed in the peripheral circuit region. For instance, device isolation patterns 81 can be formed through a patterning process using thin layer structure 100 having opening 105 as an etch mask.

Thereafter, the fabrication processes described with reference to FIGS. 2A and 2B are performed with respect to the resultant thin layer structure 100 having device isolation patterns 81 formed therein. As shown in FIG. 3C, device isolation patterns 81 are formed below first and second active patterns 208a, 208b. First and second active patterns 208a, 208b are electrically separated in a lower region by device isolation patterns 81 and first buried patterns 210.

In a modified embodiment shown in FIG. 3D, device isolation patterns 81 extend horizontally below conductive patterns 260, and device isolation patterns 260 further extend to cross trench 230. Accordingly, impurity region 270, used as the source region, is formed using a self-aligned source (SAS) technique, similar to that used for a two-dimensional NOR flash memory.

Figure 4A:
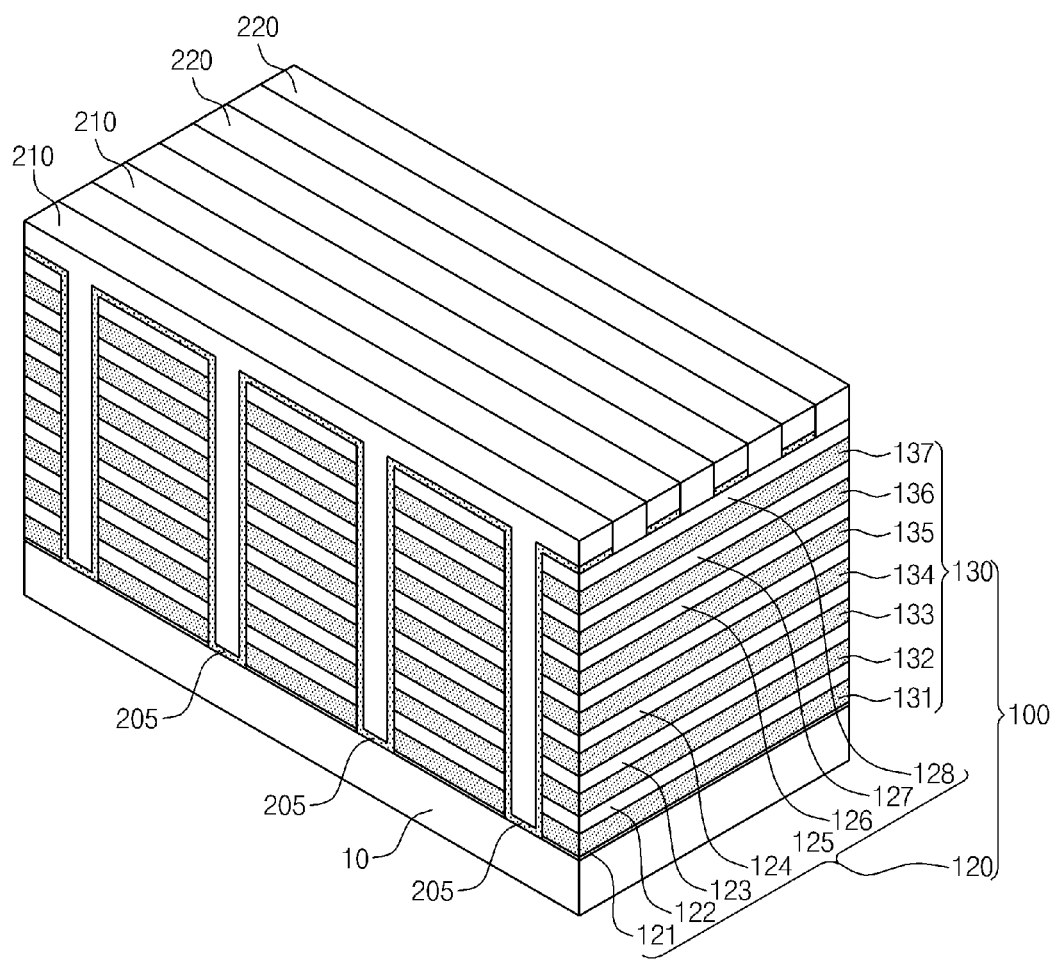
FIGS. 4A and 4B are perspective views illustrating a method of manufacturing an array structure of a three-dimensional semiconductor device according to another embodiment of the inventive concept.
Figure 4B:
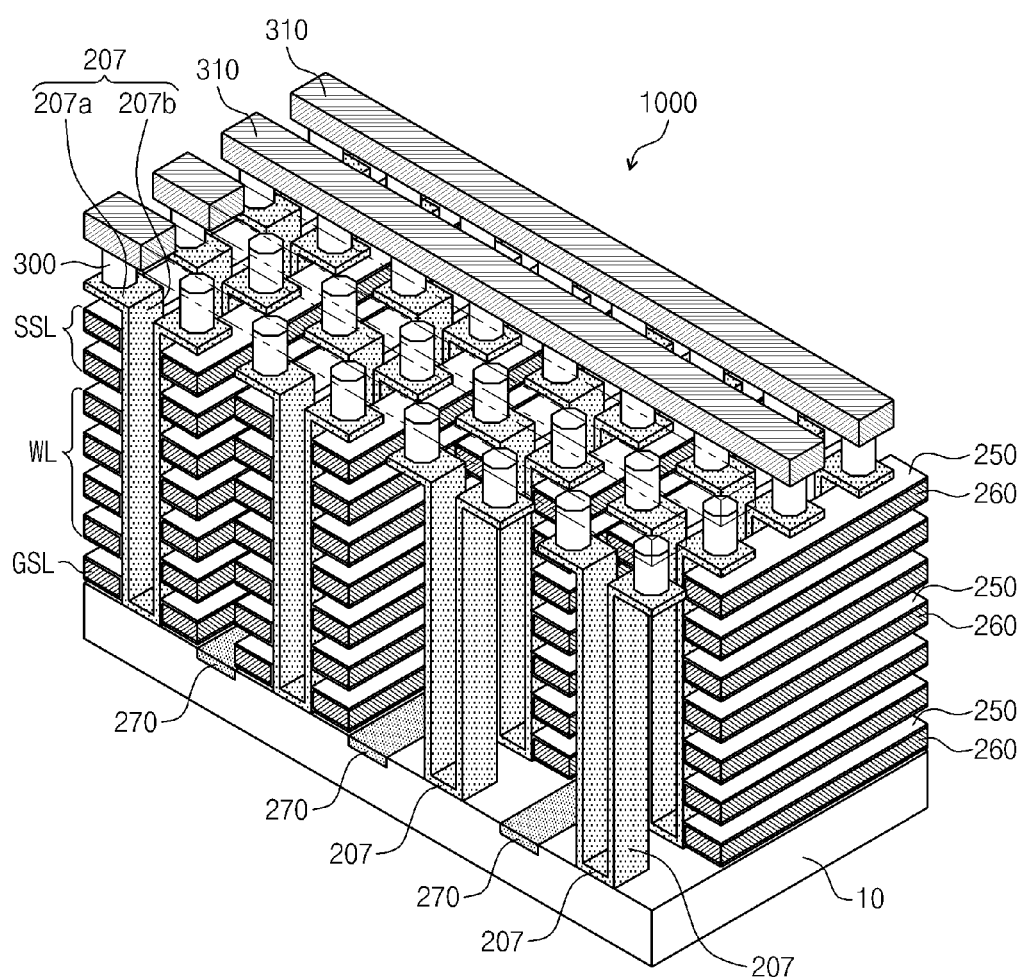

FIGS. 4A and 4B are perspective views illustrating a method of manufacturing an array structure of a three-dimensional semiconductor device according to another embodiment of the inventive concept. The embodiment of FIGS. 4A and 4B is similar to the embodiment of FIG. 1, except for differences in the formation of semiconductor pattern 205.

Accordingly, to avoid redundancy, a further description will not be provided for features already described with reference to FIG. 1.

Referring to FIG. 4A, a second buried layer filling separation holes 215 is formed, and the second buried layer is planarization-etched. The second buried layer is formed after the formation of semiconductor patterns 205, which is described with reference to FIG. 1E.

The planarization-etching is performed until a top surface of first buried pattern 210 is exposed. Accordingly, the second buried layer forms second buried patterns 220 filling separation holes 215 between first buried patterns 210, as shown in FIG. 4A. Similar to first buried patterns 210, second buried patterns 220 extend on thin layer structure 100 and are connected to one another. Meanwhile, because semiconductor patterns 205 are coved by first buried patterns 210, semiconductor patterns 205 are not etched in the planarization-etching.

Thereafter, the fabrication processes described with reference to FIGS. 1F through 1L are performed with respect to the resultant thin layer structure 100 having second buried patterns 220 formed thereon. As shown in FIG. 4B, active pattern 207 extend horizontally from opening 105 to have a pad portion 207a extending on conductive patterns 260. Pad portion 207a is formed with a conductivity type that is different from that of a main portion 207b. Upper interconnection line 310 and plug 300 are directly connected to pad portion 207a of conductive pattern 260 without separate pad pattern 290.

Figure 5A:
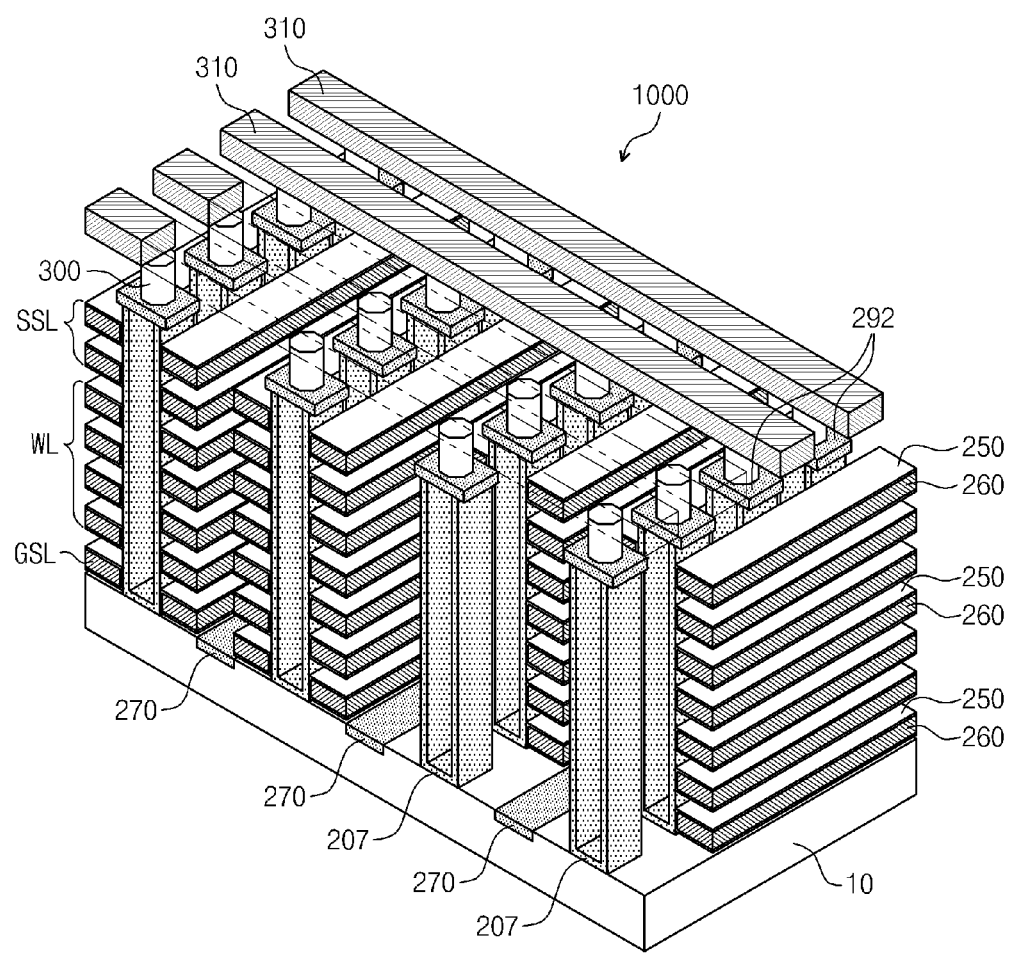
FIGS. 5A and 5B are perspective views illustrating various configurations for the shape and layout of a pad pattern in the array structure of FIG. 1.
Figure 5B:
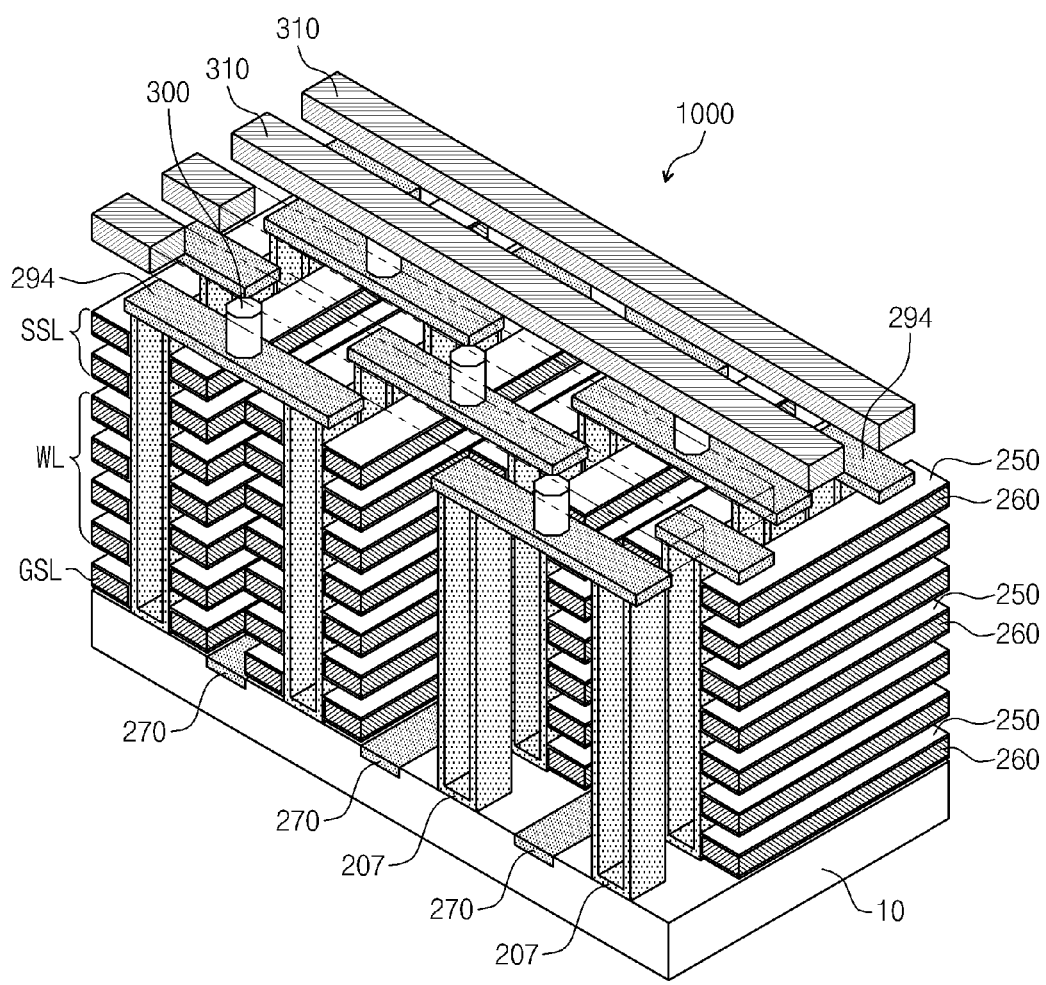

FIGS. 5A and 5B are perspective views illustrating various configurations for the shape and layout of pad pattern 290 in array structure 1000 of FIG. 1.

In a configuration shown in FIG. 5A, pad patterns 292 are formed on respective active patterns 207. Accordingly, the number of active patterns 207 connected to one of upper interconnection lines 310 is substantially the same as the number of pad patterns 292 and the number of plugs 300 connected to the same upper interconnection line.

In a configuration shown in FIG. 5B, each of pad patterns 294 is connected to the plurality of active patterns 207. The length of each of pad patterns 294 is shorter than the length of a corresponding upper interconnection line 310, and the plurality of active patterns 207 (i.e., the plurality of cell strings) share pad patterns 294.

In the following description, technical features related to a line structure electrically connecting conductive patterns 260 of array structure 1000 will be described with reference to FIGS. 6 through 19.

Figure 6:
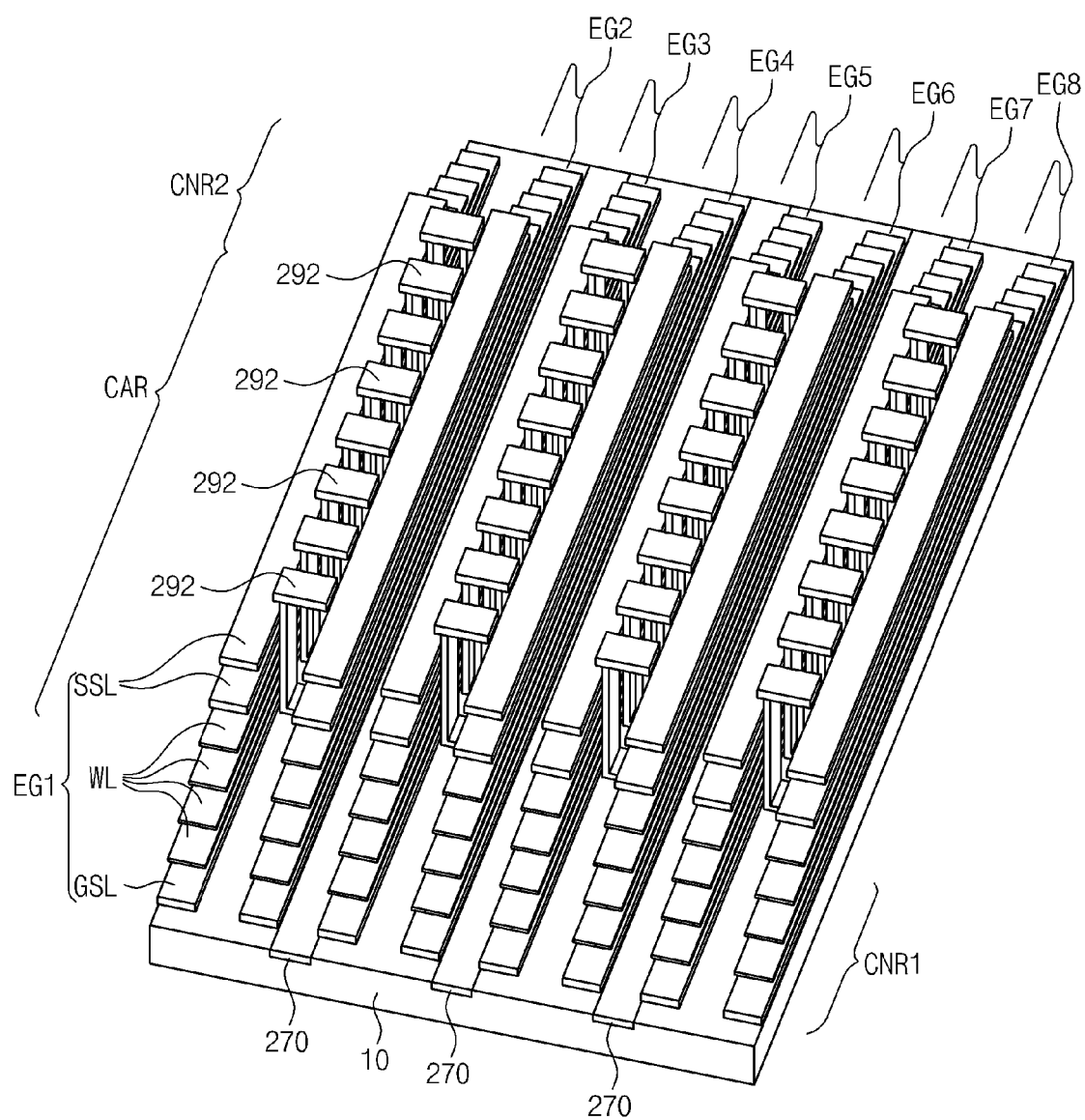
FIG. 6 is a perspective view of an array structure in a three-dimensional semiconductor device according to an embodiment of the inventive concept.

FIG. 6 is a perspective view of array structure 1000 of FIG. 5A from another angle. For simplicity of explanation, array structure 1000 of FIGS. 5A and 6 will be used as a reference for describing various alternative embodiments below. However, various aspects of the described embodiments can be applied to other embodiments of array structure 1000, such as embodiments described with reference to FIGS. 1 through 5.

Referring to FIG. 6, array structure 1000 comprises an electrode structure comprising conductive patterns 260, and active patterns 207 penetrating the electrode structure. The electrode structure comprises a plurality of electrode groups EG1-EG8 arranged horizontally, and each of the plurality of electrode groups EG1-EG8 comprises the plurality of conductive patterns 260 stacked vertically.

Active patterns 207 are disposed between the (2n+1)-th electrode group, and the (2n+2)-th electrode group, where n varies from zero to three. For example, as shown in FIG. 6, active patterns 207 are disposed between first electrode group EG1 and second electrode group EG2, between third electrode group EG3 and fourth electrode group EG4, between fifth electrode group EG5 and sixth electrode group EG6, and between seventh electrode group EG7 and eighth electrode group EG8. However, active pattern 207 is not disposed between second electrode group EG2 and third electrode group EG3, between fourth electrode group EG4 and fifth electrode group EG5, and between sixth electrode group EG6 and seventh electrode group EG7.

Impurity regions 270 used as a source line are formed in substrate 10 between second electrode group EG2 and third electrode group EG3, between fourth electrode group EG4 and fifth electrode group EG5, and between sixth electrode group EG6 and seventh electrode group EG7. As a result, active patterns 207 are formed horizontally spaced apart from impurity regions 270.

At least one of conductive patterns 260 constituting one electrode group are spatially separated from conductive patterns 260 constituting another electrode groups. For example, at least one of conductive patterns 260 constituting an (2n+1)-th electrode group is separated from conductive patterns 260 constituting the (2n+2)-th electrode group.

Conductive patterns 260 are formed with a stepwise structure in connection region CNR, as shown in FIG. 6. The stepwise structure of conductive patterns 260 can be formed through a manufacturing method disclosed in Korean Patent Application No. 2009-0099370, or a variation thereof. The disclosure of Korean Patent Application No. 2009-0099370 is hereby incorporated by reference.

As indicated by the foregoing, in certain embodiments, stacked conductive patterns 260 are used as a sting selection line SSL, a ground selection line GSL, and word lines WL in a three-dimensional flash memory device.

Figure 7:
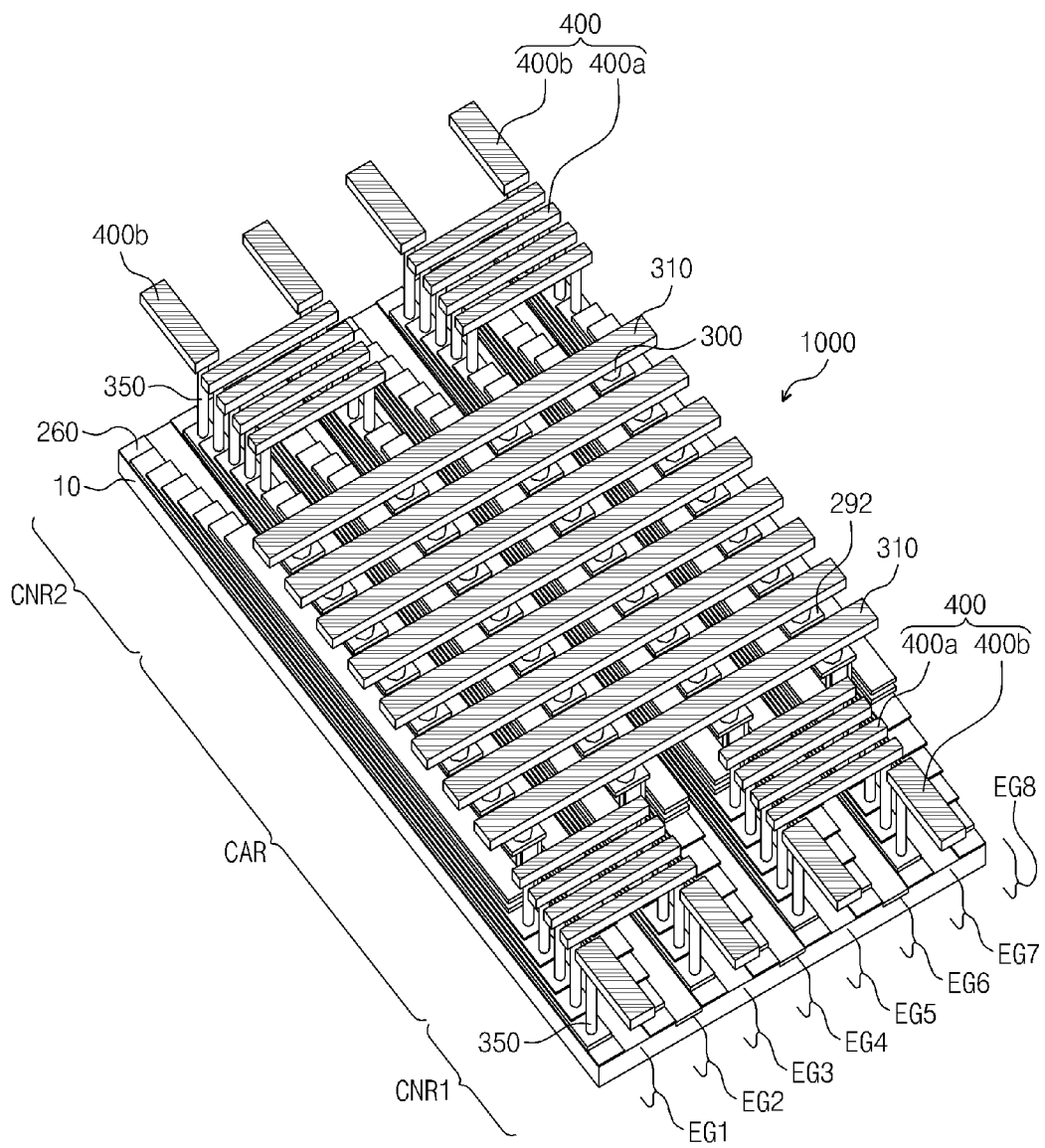
FIGS. 7 through 9 are perspective views illustrating a first interconnection line structure of a three-dimensional semiconductor device according to an embodiment of the inventive concept.
Figure 8:
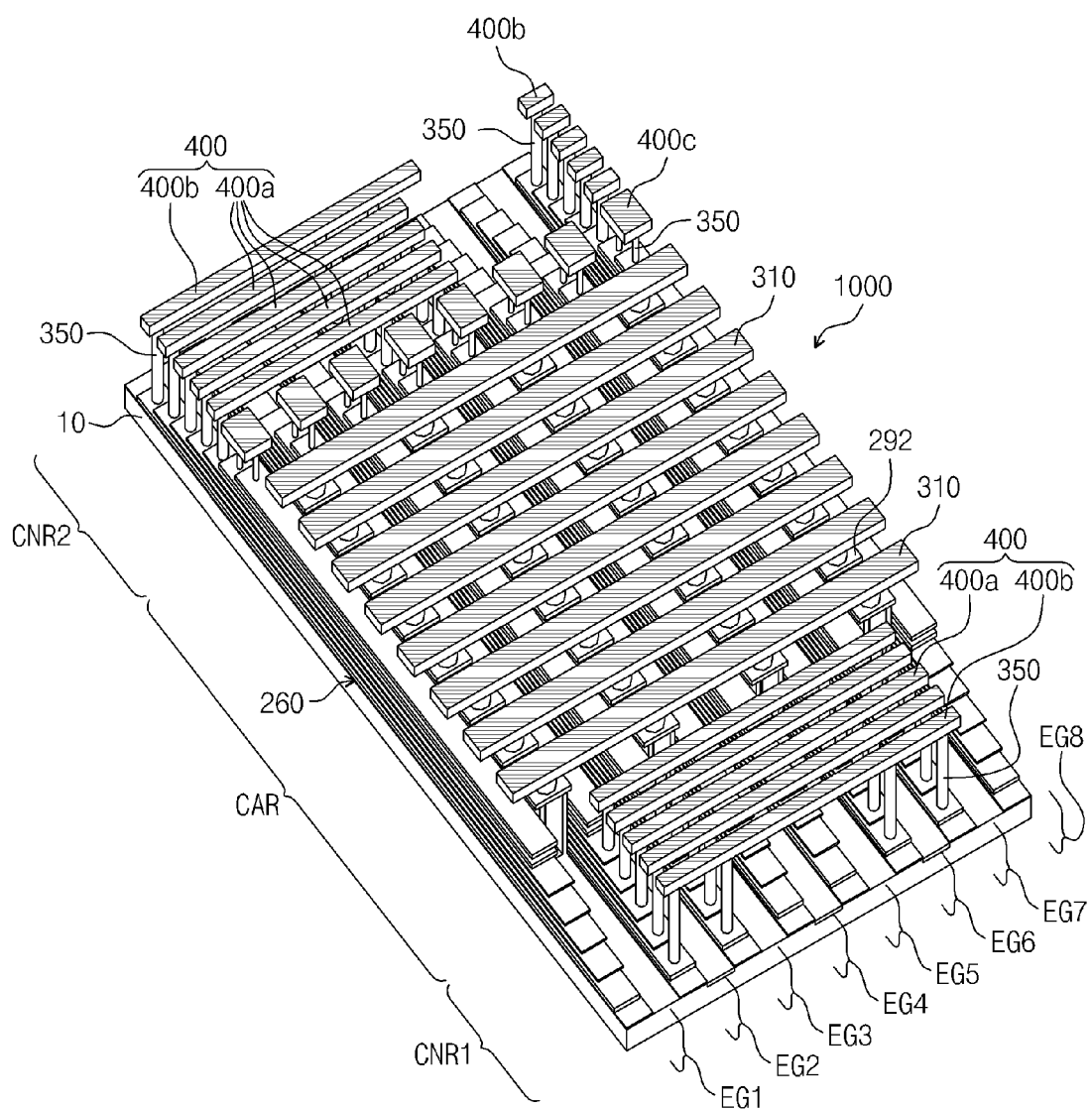
Figure 9:
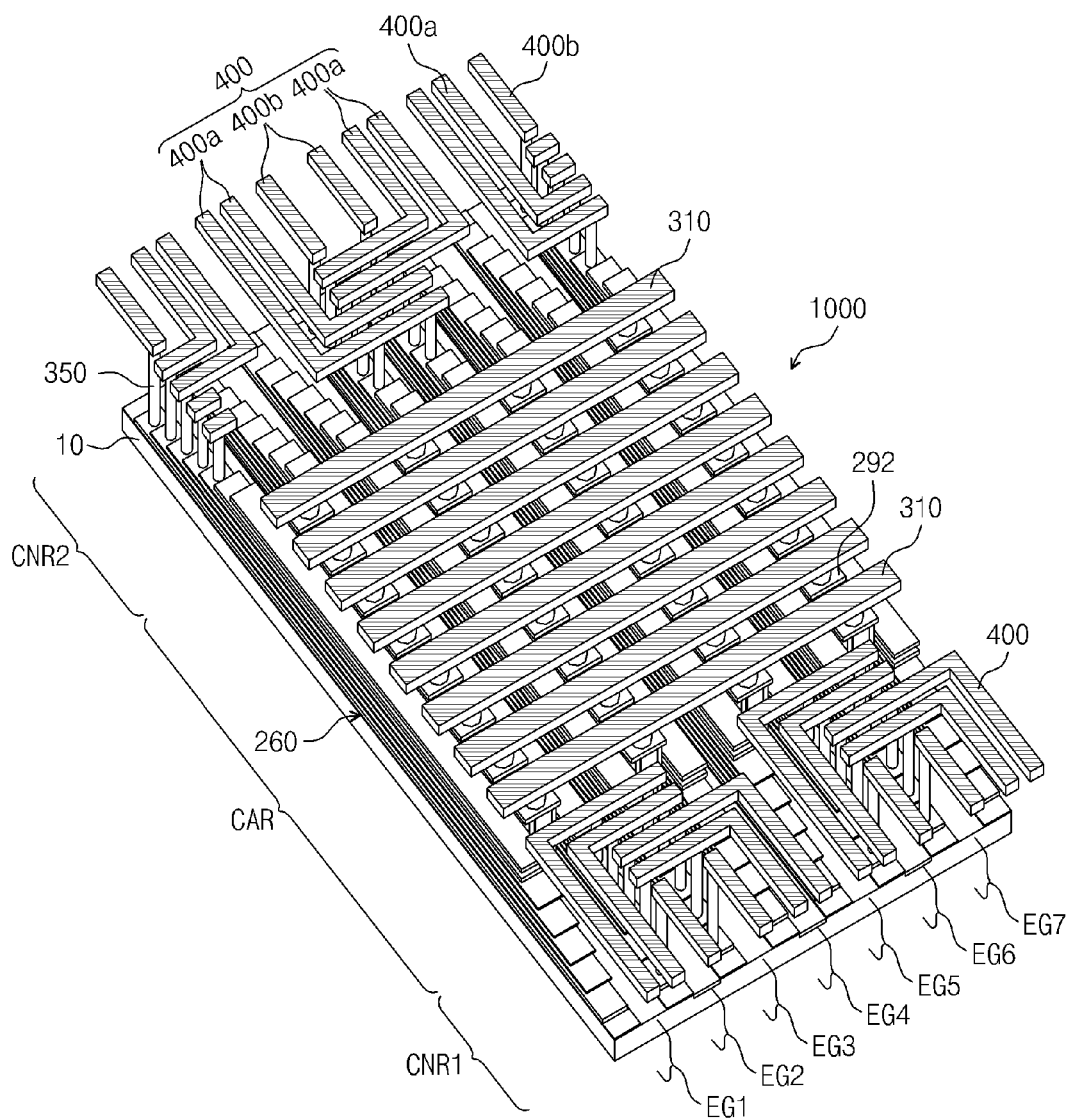

Referring to FIGS. 7 through 9, first plugs 350 connected to conductive patterns 260, and first interconnection lines 400 connected to first plugs 350 are formed.

First plugs 350 and first interconnection lines 400 are disposed in both a first connection region CNR1 and a second connection region CNR2, which are located on opposite sides of cell array region CAR. Some of conductive patterns 260 constituting electrode groups EG1-EG8 are connected to first plugs 350 and first interconnection lines 400 in first connection region CNR1, and some of conductive patterns 260 constituting electrode groups EG1-EG8 are connected to first plugs 350 and first interconnection lines 400 in second connection region CNR2.

More concretely, as shown in FIG. 7, word lines WL and ground selection lines GSL that are included in odd electrode groups EG1, EG3, EG5, EG7 and are positioned at the same height are connected in first connection region CNR1 and are in an equipotential state, and conductive patterns 260 that are included in even electrode groups EG2, EG4, EG6, EG8 and are positioned at the same height are connected in second connection region CNR2 and are in an equipotential state. First interconnection lines 400 connected to word lines WL constitute a first local line 400a, which is locally formed on connection regions CNR1, CNR2, and first interconnection lines 400 connected to ground selection line GSL constitute a global ground selection line extending beyond connection regions CNR1, CNR2.

In other embodiments, shown in FIGS. 8 and 9, word lines WL and ground selection lines GSL that are included in the (2n+2)-th electrode group and the (2n+3)-th electrode group and are positioned at the same height are connected in first connection region CNR1 and are in an equipotential state, and word lines WL and ground selection lines GSL that are included in the (2n+4)-th electrode group and the (2n+5)-th electrode group and are positioned at the same height are connected in second connection region CNR2 and are in an equipotential state.

In the embodiment of FIG. 8, the number of plugs 350 and conductive patterns 260 connected to first local line 400a is greater than the number of plugs 350 and conductive patterns 260 in the embodiment of FIG. 7. In the embodiment of FIG. 8, four or more word lines WL can be electrically connected to one of first local lines 400a. Additionally, in the embodiment of FIG. 8, some of first plugs 350 and some of first interconnection lines 400 are formed to be connected to string selection lines SSL. The first interconnection lines (i.e., 400c) connected to string select lines SSL can be used as contact pads for electrical connection with a second interconnection line 410, as will be described below.

In the embodiment of FIG. 9, two word lines WL are electrically connected to one of first interconnection lines 400, and the first interconnection lines extend to the decoding circuit region beyond connection regions CNR1, CNR2. Accordingly, in the embodiment of FIG. 9, first interconnection lines 400 connected to word lines WL are used as global word lines.

First plug 350 and first interconnection line 400 can be formed simultaneously with plug 300 and upper interconnection line 310 by using the process for forming plug 300 connected to active pattern 207, and upper interconnection line 310. First plug 350 and first interconnection line 400 can share various characteristics with plug 300 and upper interconnection line 310, respectively, such as composition of material, height of top surface, and thickness of thin layer.

Figure 10:
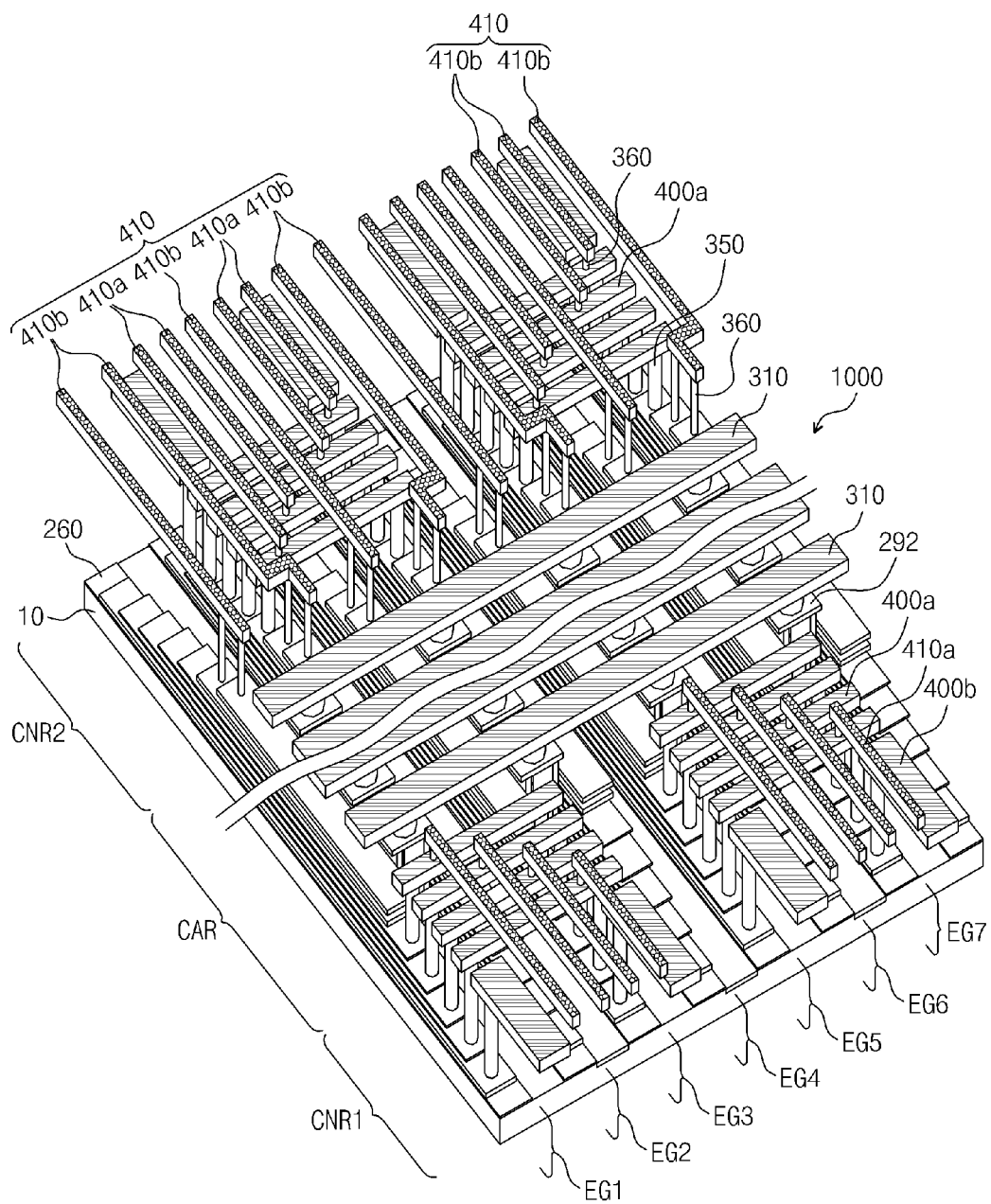
FIGS. 10 through 17 are perspective views illustrating a second interconnection line structure of a three-dimensional semiconductor device according to an embodiment of the inventive concept.
Figure 11:
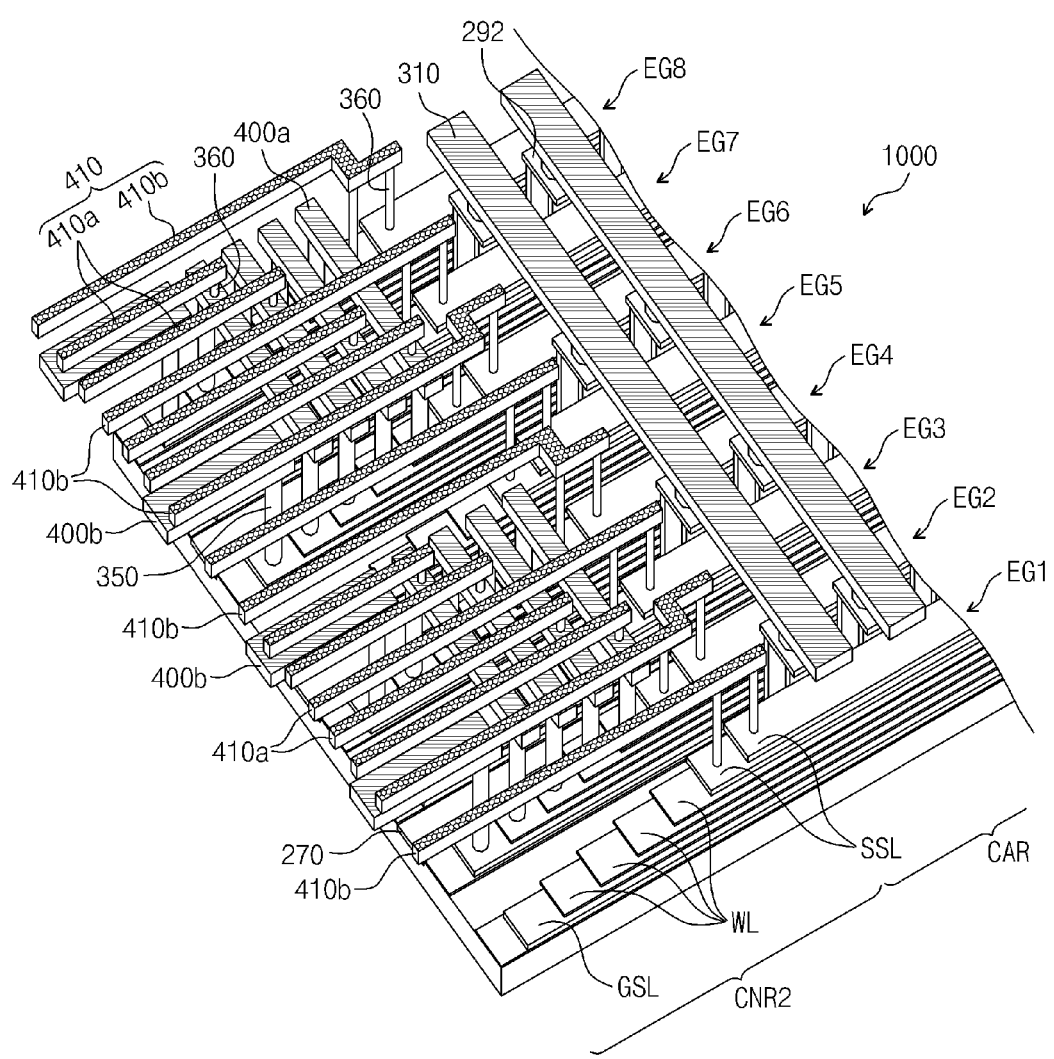
Figure 12:
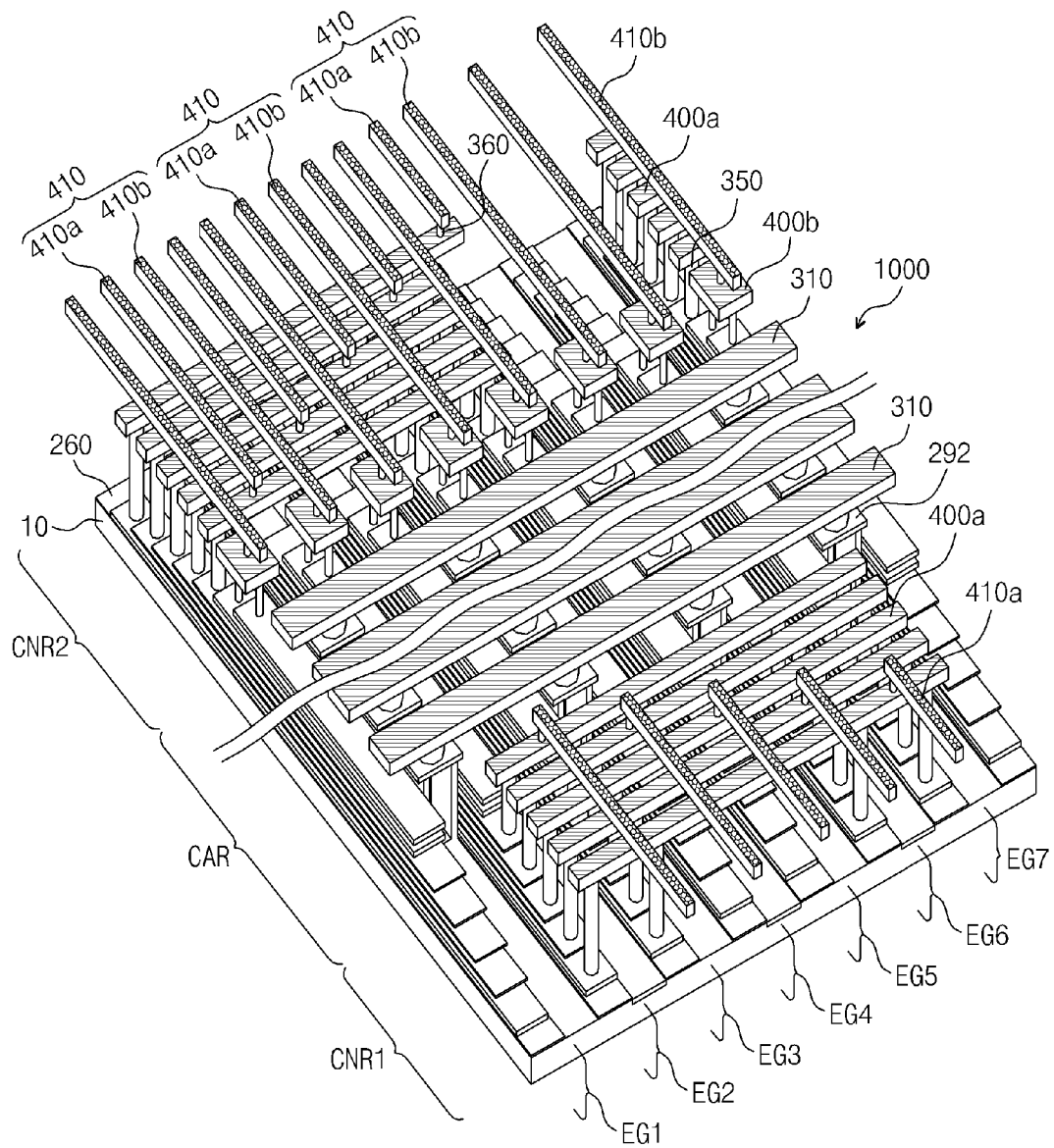
Figure 13:
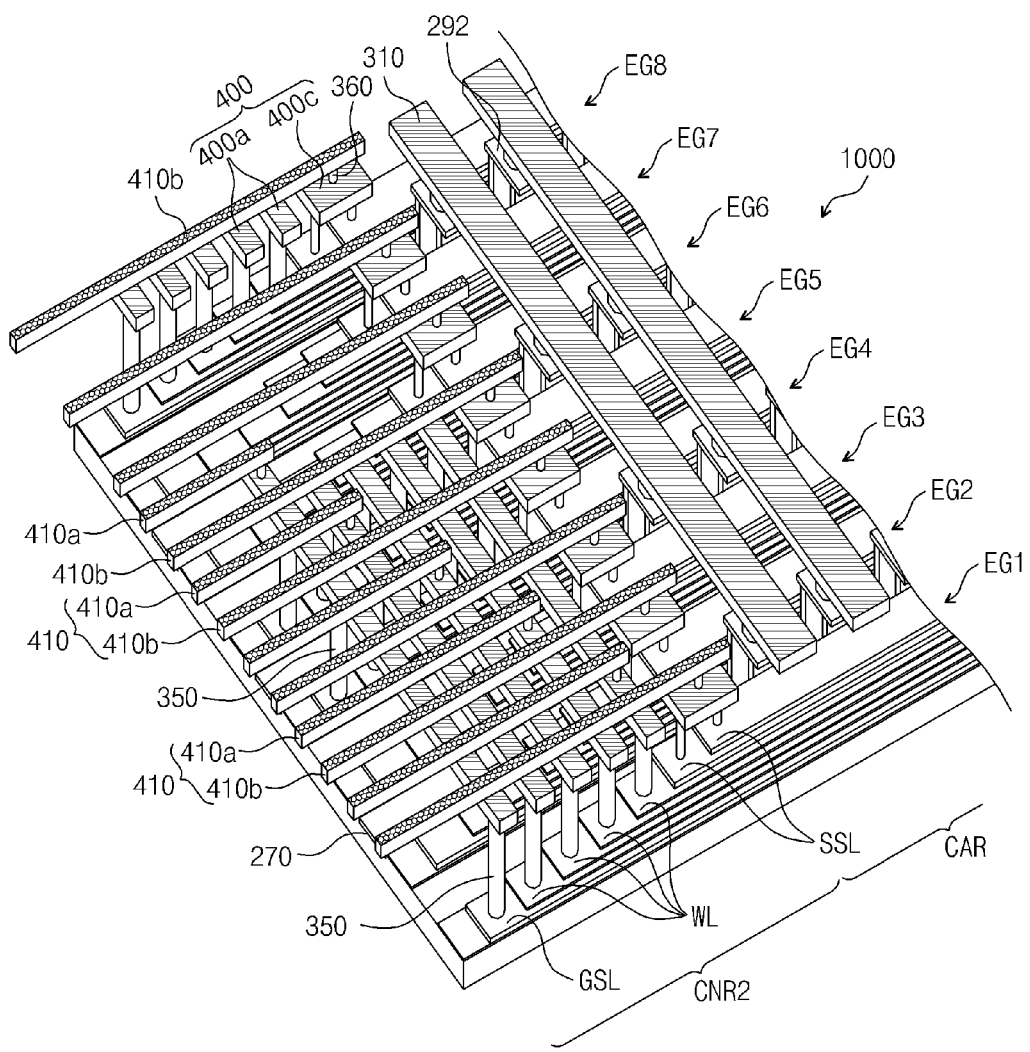
Figure 14:
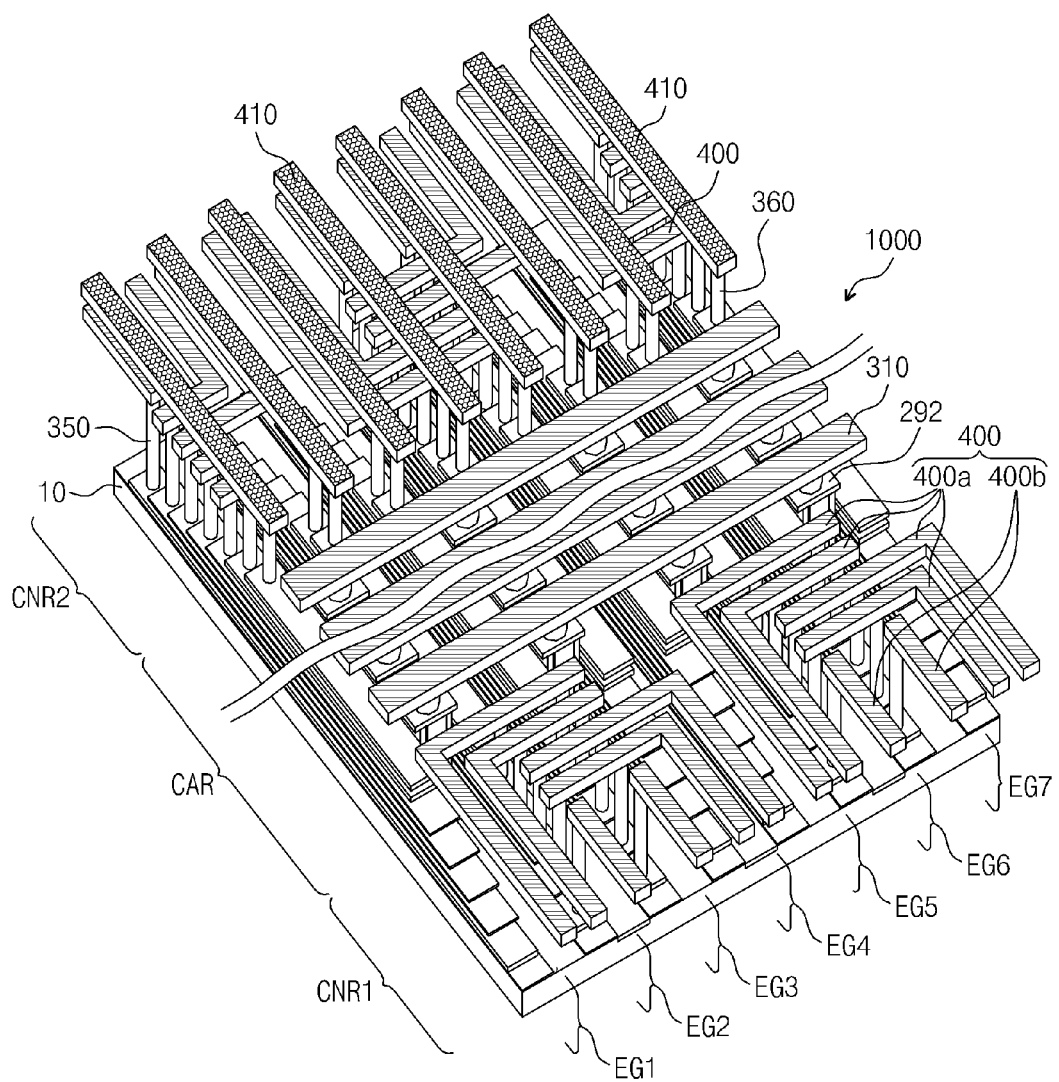
Figure 15:
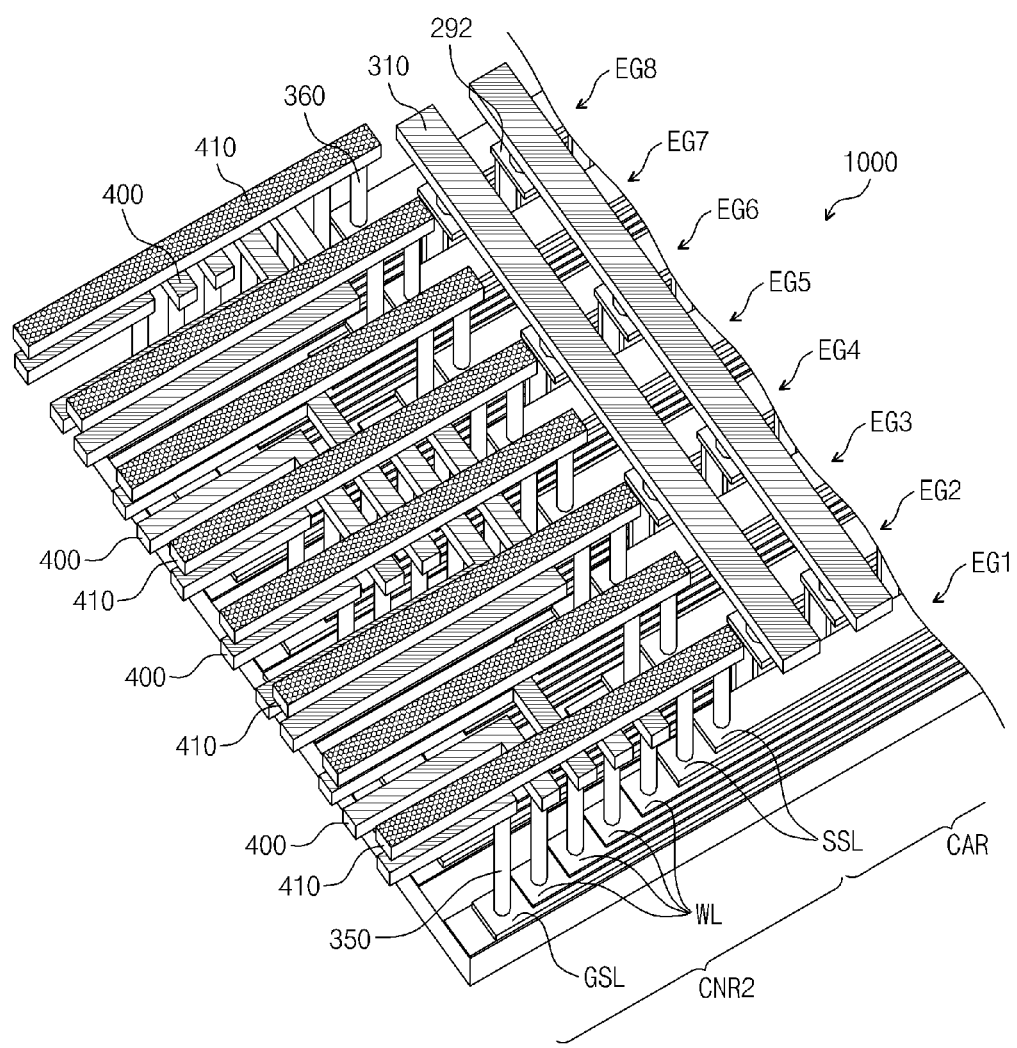
Figure 16:
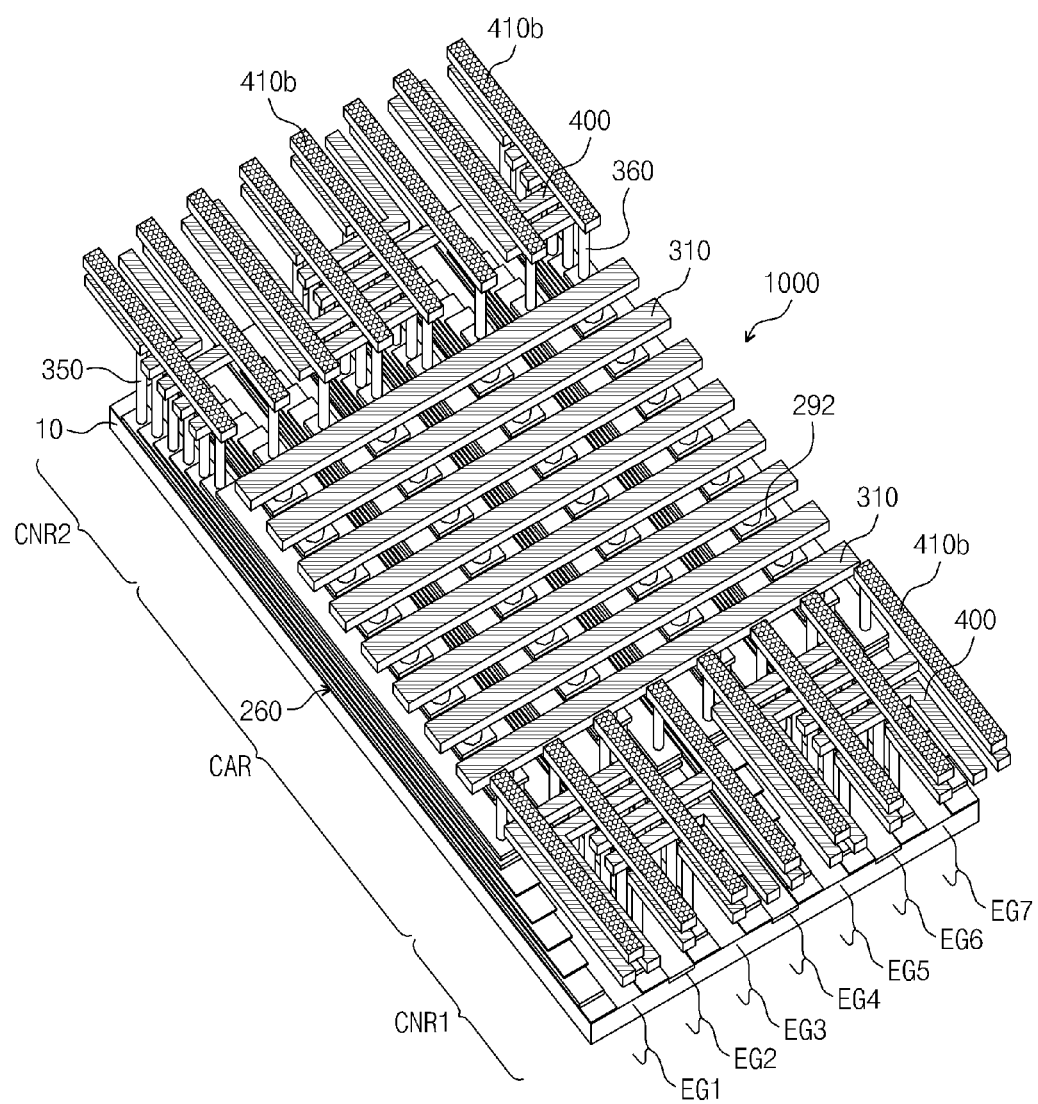
Figure 17:
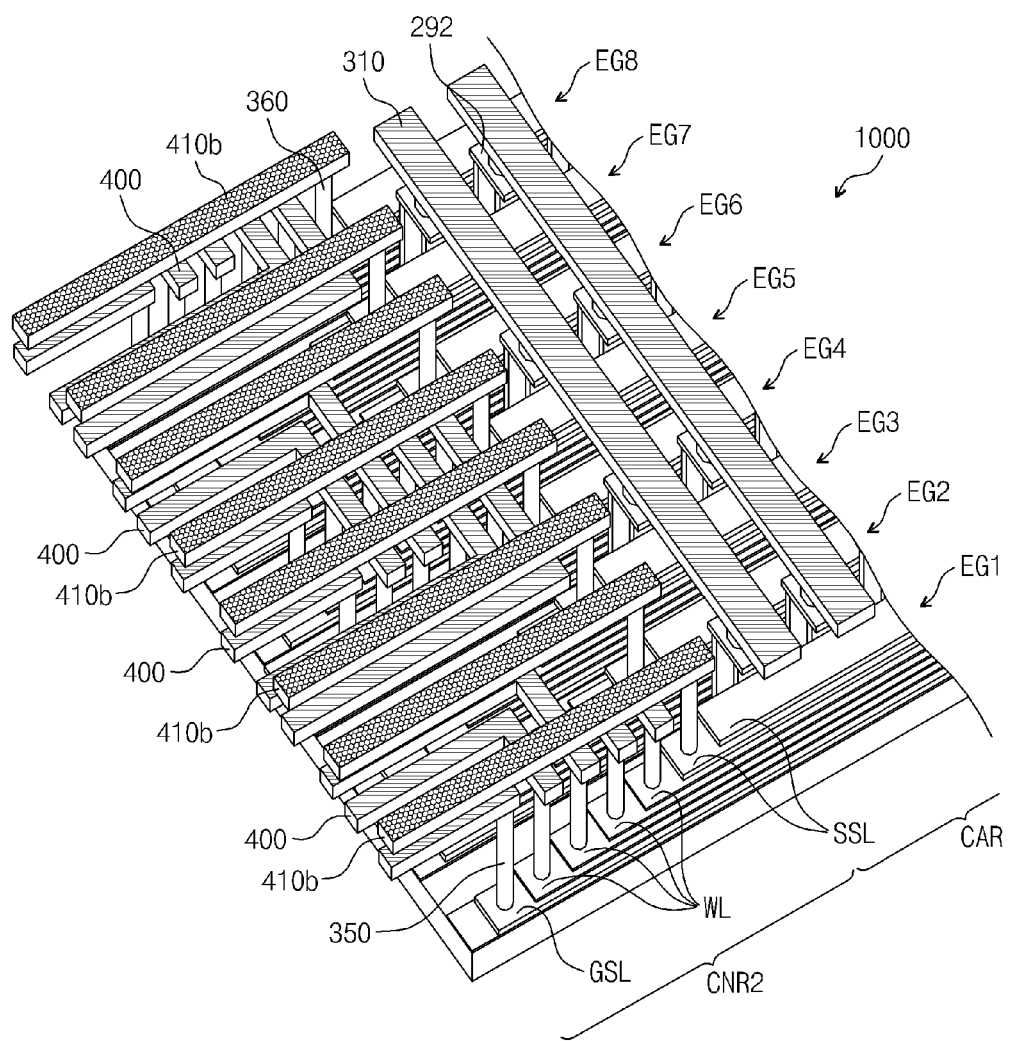

Referring to FIGS. 10 through 17, second plugs 360 connected to first interconnection lines 400, and second interconnection lines 410 connected to second plugs 360, are formed. FIGS. 10, 12 and 14 are perspective views of resultant structures having second plugs 360 and second interconnection lines 410 additively formed on the structures of FIGS. 7, 8 and 9. FIGS. 11, 13 and 15 are perspective views of the structures of FIGS. 10, 12 and 14 shown from another angle. FIGS. 16 and 17 are perspective views illustrating variations of the structures of FIGS. 14 and 15.

Second interconnection lines 410 electrically connect first interconnection lines 400 to elements of the decoding circuit region. Where first interconnection lines 400 are disposed in both of the first and second connection regions CNR1 and CNR2 as described above, second plugs 360 and second interconnection lines 410 are equally disposed in both of first and second connection regions CNR1 and CNR2. Word lines WL in each of electrode groups EG1-EG8 are electrically connected to one of second interconnection lines 410 through first plug 350, first interconnection line 400, and second plug 360.

As shown in FIGS. 10 through 17, second interconnection lines 410 comprise global word lines 410a connected to first local line 400a, and global string selection lines 410b connected to uppermost conductive patterns 260 used as string selection lines SSL.

As shown in FIGS. 12 and 13, where first interconnection lines 400c are included, second plug 360 is connected to a top surface of contact pad 400c.

Where each of electrode groups EG1-EG8 comprises string selection lines SSL having a multi-layer structure, global string selection lines 410b are disposed in both of first and second connection regions CNR1 and CNR2, as shown in FIGS. 16 and 17. Accordingly, one electrode group is connected to two global string selection lines 410b, and the two corresponding global string selection lines 410b are respectively connected to string selection lines SSL formed at different heights.

Figure 18:
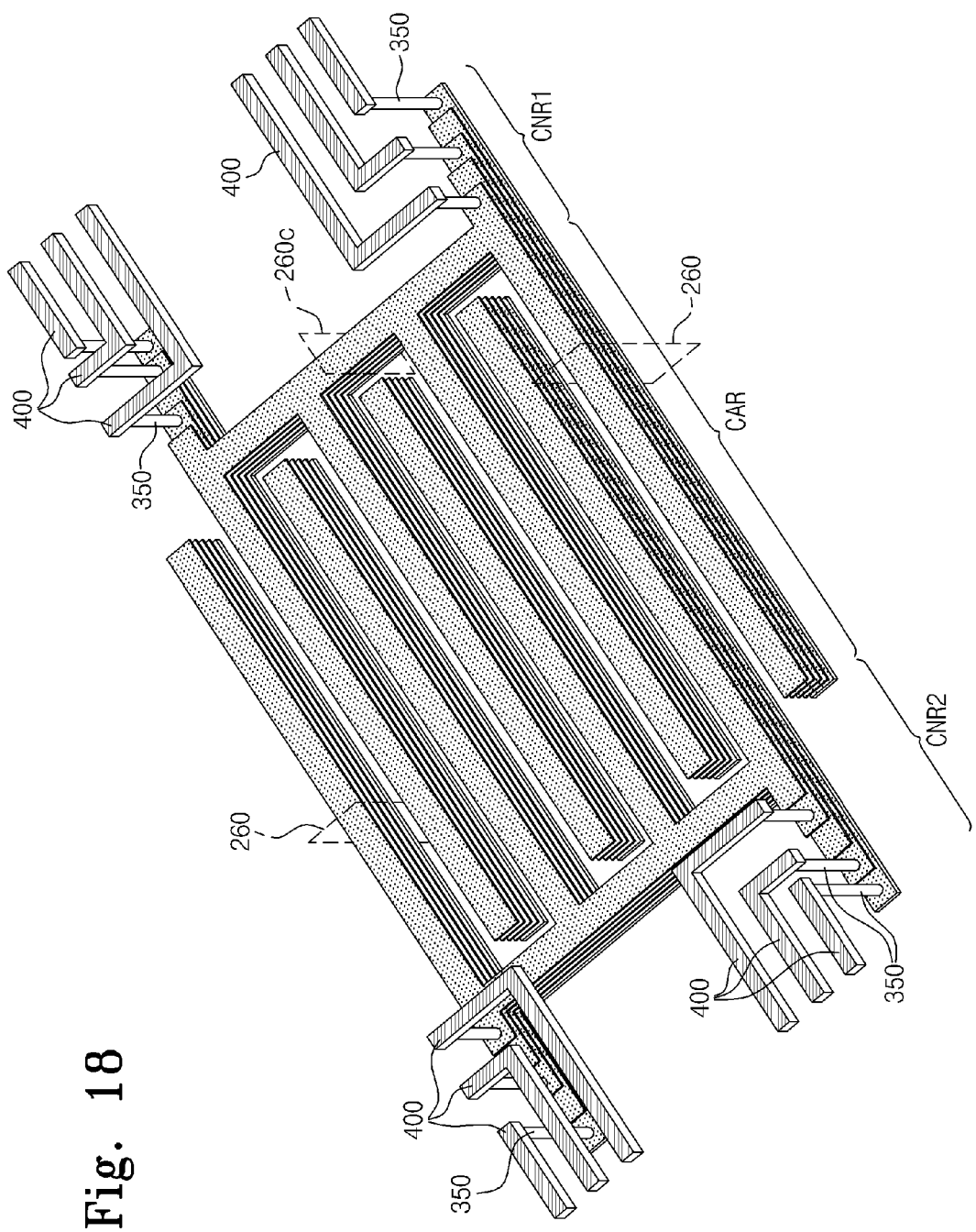
FIGS. 18 and 19 are perspective views illustrating interconnection line structures according to still other embodiments of the inventive concept.
Figure 19:
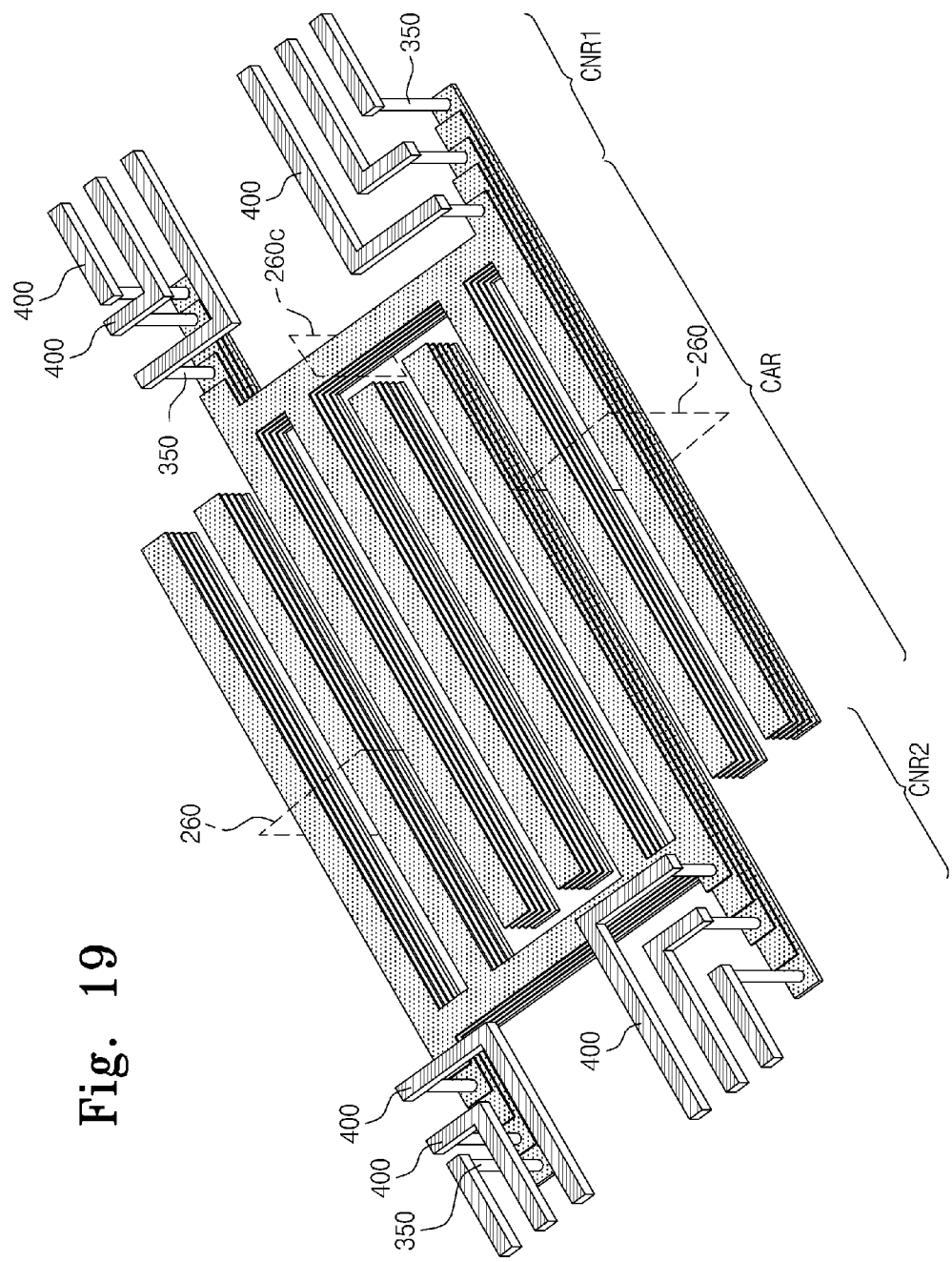

FIGS. 18 and 19 are perspective views illustrating line structures according to still other embodiments of the inventive concept.

In the embodiments of FIGS. 18 and 19, conductive pattern 260 comprises a connection portion 260c disposed in connection regions CNR1, CNR2. Connection portion 260c connects the plurality of conductive patterns 260. Accordingly, the plurality of conductive patterns 260 connected by connection portion 260c have an equipotential state. Meanwhile, first plugs 350 and first interconnection lines 400 described with reference to FIGS. 7 through 9 are further formed on conductive patterns 260.

In the embodiment of FIG. 18, word lines WL included in even electrode groups EG2, EG4, EG6, EG8 and located at the same height are connected with each other by connection portion 260c in one of first and second connection regions CNR1 and CNR2, and word lines WL included in odd electrode groups EG1, EG3, EG5, EG7 and located at the same height are connected with each other by connection portion 260c in the other one of first and second connection regions CNR1 and CNR2.

In the embodiment of FIG. 19, word lines WL included in the (2n+2)-th electrode group and the (2n+3)-th electrode group and located at the same height are connected in first connection region CNR1 and have an equipotential state, and word lines WL included in the (2n+4)-th electrode group and the (2n+5)-th electrode group and located at the same height are connected in second connection region CNR2 and have an equipotential state.

Figure 20:
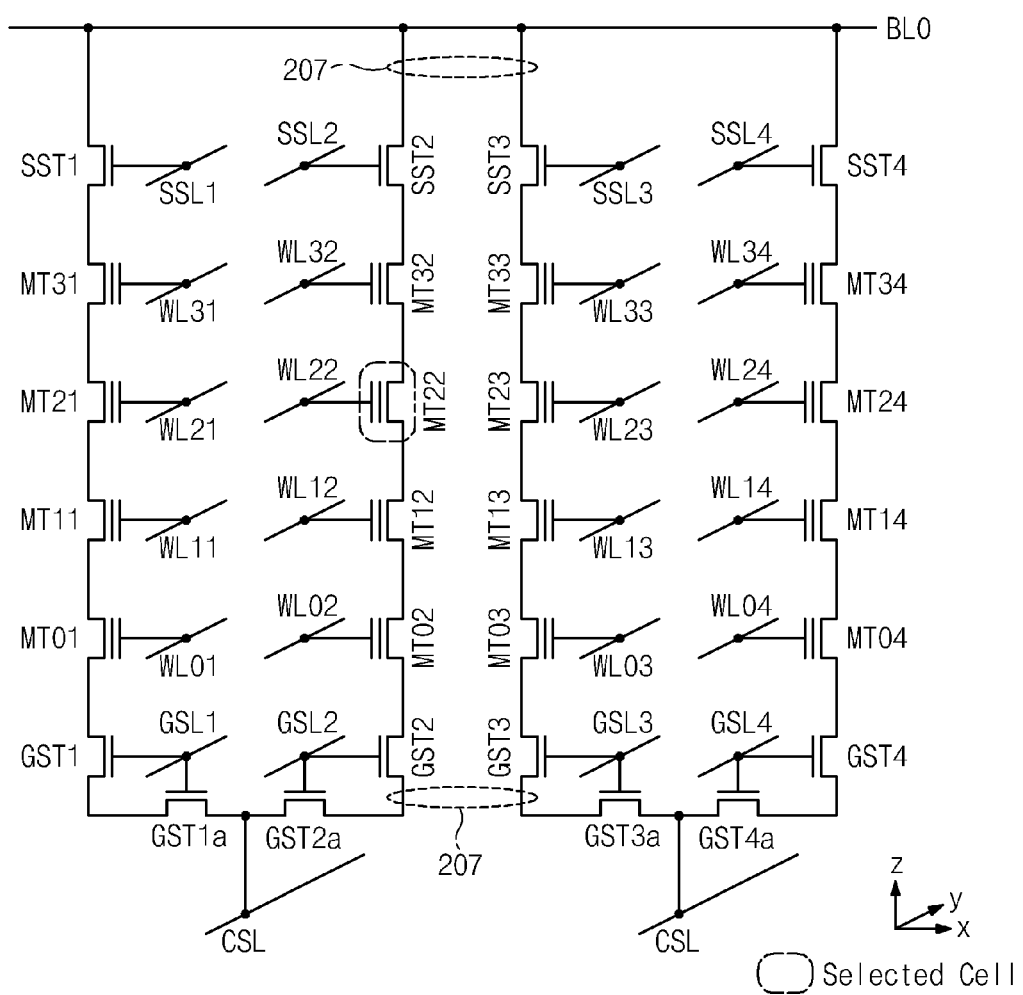
FIG. 20 is a circuit diagram illustrating a cell array region of a three-dimensional NAND flash memory device according to an embodiment of the inventive concept.

FIG. 20 is a circuit diagram illustrating a cell array region of a three-dimensional NAND flash memory device according to an embodiment of the inventive concept. The cell array of the three-dimensional NAND flash memory device comprises memory cells arranged three-dimensionally. However, to avoid complexity in the drawing, FIG. 20 shows memory cells arranged on an x-z plane.

Referring to FIG. 20, a plurality of cell strings connected to a common source line CSL are commonly connected to one bit line BL0. Each of the cell strings comprises a plurality of transistors connected in series. For example, a first one of the cell strings comprises a string selection transistor SST1, a ground selection transistor GST1, GST1a, and a plurality of memory transistors MT01-MT31 connected in series therebetween.

String selection transistors SST1-SST4 (SST) comprise MOSFETs connected to respective string selection lines SSL1-SSL4 (SSL) crossing bit line BL0, and ground selection transistors GST1-GST4, GST1a-GST4a (GST) comprise MOSFETs connected to respective ground selection lines GSL1-GSL4 (GSL). Memory transistors MT01-MT34 (MT) comprise MOSFETs connected to corresponding word lines WL01-WL34 (WL) crossing bit line BL0 between string selection lines SSL and ground selection lines GSL. Memory transistors MT use information storage element 250 described with reference to FIG. 1I as a gate dielectric layer. String selection transistor SST and ground selection transistor GST also use information storage element 250 as a gate dielectric layer.

Memory transistors MT, string selection transistors SST, and ground selection transistors GST use active patterns 207 or 208 as active regions or channel regions. Memory transistors MT are formed in regions where active patterns 207 or 208 and word lines WL cross. As described above with reference to FIG. 1M, each of active patterns 207 or 208 has two separate extending portions, such as a first active pattern 208a and a second active pattern 208b shown in FIG. 2B. Additionally, as shown in FIG. 6, two electrode groups disposed at both sides of one active pattern 207 or 208 can be electrically separated from each other.

The spatial separation of the two portions constituting active pattern 207 or 208, or the electrical separation between the electrode groups, makes it possible to use two information storage elements or two memory transistors (hereafter, "adjacent cells"), which are disposed at both sides of each of active patterns 207 or 208 at the same height from substrate 10, as two distinct memory regions. Consequently, the adjacent cells can be written or read independently from each other. In the description that follows, example write and read operations for adjacent cells will be described with reference to FIGS. 20 through 25.

Conductive patterns 260 (i.e., the lowermost conductive patterns in electrode groups BG) used as ground selection lines GSL are configured to effectively control an electric potential of the top surface of substrate 10. This configuration can be implemented by controlling the thickness of lowermost insulating layer 121 (hereafter, "lower insulating layer") among insulating layers 120. In certain embodiments, a distance between ground selection line GSL and substrate 10 is substantially the same as a sum of the thickness of lower insulating layer 121 and the thickness of information storage element 250. Therefore, if the thickness of lower insulating layer 121 is decreased, the electric potential of the top surface of substrate 10 can be effectively controlled by ground selection line GSL.

According to this configuration, each of ground selection lines GSL is used as a gate electrode common to two transistors connected in series. Of the two transistors, one is a vertical transistor in which active pattern 207 or 208 is used as a channel, and the other is a horizontal transistor in which the top surface of substrate 10 is used as a channel. According to some embodiments of the inventive concept, threshold voltages of vertical transistors GST1-GST4 are different from those of horizontal transistors GST1a-GST4a. Such a differences in threshold voltages can be realized through at least one of a difference in the impurity concentration and a difference in the crystal structure between active pattern 207 or 208 and substrate 10. Such differences in the threshold voltages can also be realized through a difference in the distance from active pattern 207 or 208 and substrate 10 to ground selection line GSL or a difference in the dielectric constant of dielectric layers interposed therebetween. The differences in threshold voltages between vertical transistors GST1-GST4 and horizontal transistors GST1a-GST4a may be used to more effectively control the electrical connection to active pattern 207 or 208, or can be used for a selective connection to one of two portions constituting active pattern 207 or 208.

FIGS. 21 through 23 are tables for describing a method of operating a three-dimensional semiconductor device according to an embodiment of the inventive concept, and FIGS. 24 and 25 are tables for describing a method of operating a three-dimensional semiconductor device according to another embodiment of the inventive concept.

More specifically, FIGS. 21 through 23 are tables for describing program, erase, and read operations in three-dimensional semiconductor devices comprising the line structures described with reference to FIGS. 7, 10 and 18, based on the cell array structure shown in FIG. 20, and FIGS. 24 and 25 are tables for describing program, erase and read operations in three-dimensional semiconductor devices comprising the line structures described with reference to FIGS. 8, 9 and 19, based on the cell array structure shown in FIG. 20. In the tables of FIGS. 21 through 25, entries shown in first, fourth, seventh, and tenth columns correspond to elements shown in FIG. 20.

Referring to FIGS. 21 and 24, a selected memory cell of FIG. 20 is programmed by applying a potential difference between a program voltage Vpgm and a ground voltage GND across a selected word line WL22 and a selected bit line BL0. A first pass voltage and a second pass voltage are respectively applied to a string selection line SSL2 of a cell string (hereafter, a "selected string") connected to selected word line WL22, and other word lines WL02, WL12, WL32 such that ground voltage GND is transferred from selected bit line BL0 to a region of active pattern 207 adjacent to selected word line WL22. The first pass voltage is a voltage that is higher than a threshold voltage of the corresponding string selection transistor SST2, and lower than program voltage Vpgm, such as a power voltage Vcc. The second pass voltage is a voltage (hereafter, a "pass voltage") that is higher than a threshold voltage of a memory transistor in a programmed state and lower than program voltage Vpgm.

Meanwhile, a voltage (e.g., ground voltage) that can cause ground selection transistors GST1-GST4 to be in off state is applied to ground selection lines GSL1-GSL4. Also, ground voltage GND is applied to string selection lines SSL1, SSL3, SSL4 of cell strings (hereafter, "inhibited strings") not including selected word line W22. The inhibited strings are electrically separated from selected bit line BL0 and are in a floating state.

Selected word line WL22 is in an equipotential state with a gate electrode of a memory transistor in the inhibited string. Such a gate electrode is called a "conjugated word line". Accordingly, in the embodiments described with reference to FIGS. 7, 10 and 18, as shown in FIG. 21, program voltage Vpgm is applied to at least one conjugated word line WL24 in addition to selected word line WL22. Moreover, in the embodiments described with reference to FIGS. 8, 9 and 19, as shown in FIG. 24, program voltage Vpgm is applied to a conjugated word line WL23 adjacent to selected word line WL22.

Because the inhibited strings are in the floating state, the inhibited strings have an electric potential boosted by program voltage Vpgm and the second pass voltage (e.g., Vpass). This boosting in the inhibited strings can prevent a memory transistor connected to the conjugated word line (WL24 of FIG. 21 or WL23 of FIG. 24) from being programmed.

In another embodiment, a self-boosting technique used in two dimensional flash memory devices can be applied to prevent inhibited strings from being programmed. For example, as shown in FIGS. 21 and 24, a voltage (e.g., Vcc) that is higher than ground voltage GND is applied to non-selected bit lines BL1-n. In still embodiments, prior to a program operation for the selected cell, a pre-charging operation for elevating the electric potential of the inhibited strings to a predetermined level (e.g., the electric potential boosted by the self-boosting technique) can be performed.

Because one pair of electrode groups disposed adjacent to one active pattern 207 or 208 are electrically separated, only one of two portions which are spatially separated and constitute one active pattern 207 or 208 is connected to selected bit line BL0 to which ground voltage GND is applied. Therefore, a program operation for the "adjacent cell" sharing one active pattern 207 or 208 is independently performed.

As shown in FIG. 22, a plurality of memory cells, which include the "selected cell" and are included in one block, are substantially concurrently erased by using a difference between an erase voltage Verase applied to substrate 10 (bulk) and ground voltage GND applied to word lines WL.

As shown in FIGS. 1M, 2B, 3C, 3D, 4B, 5A, and 5B, active patterns 207 can be formed to directly contact substrate 10. Active pattern 207 can also be formed to have the same conductivity type as substrate 10. Therefore, the voltage applied to substrate 10 can be directly transferred to active patterns 207. Alternatively, where a rectifying element such as a diode is formed between active pattern 207 and substrate 10, the electric potential of substrate 10 may not be directly transferred to substrate 10.

As shown in FIGS. 23 and 25, a first voltage V1 that is higher than ground voltage GND is applied to selected bit line BL0, and the ground voltage is applied to common source line CSL. In addition, a read voltage Vread is applied to ground selection line GSL2 and string selection line SSL2 included in the selected string. Read voltage Vread can be higher than threshold voltages of ground selection transistor GST and string selection transistor SST. For example, read voltage Vread can be a voltage that is higher than a threshold voltage of a memory transistor in a program state and lower than program voltage Vpgm.

Accordingly, first voltage V1 and ground voltage GND can be applied to both terminals of the selected cell from selected bit line BL0 and common source line CSL, respectively. Consequently, a current (hereafter, a "read current") through the selected cell is determined by information (i.e., charge amount) stored in the selected cell. During such a read operation, the ground voltage is applied to string selection lines SSL1, SSL3, SSL4 of non-selected strings. Accordingly, in other strings, a path for the read current is not formed.

Because one pair of electrode groups, which are disposed adjacent to one active pattern 207 or 208, are electrically separated, only one of two portions, which constitute one active pattern 207 or 208 and are spatially separated, is used as a path through which the read current flows. Accordingly, the read operation for the "adjacent cells" sharing one active pattern 207 or 208 can be performed independently.

Some of ground selection lines GSL can be electrically connected to each other, and thus be in an equipotential state. For example, ground selection lines GSL can be formed to have the same connection structure as word lines WL positioned above them. For instance, ground selection line GSL2 of the selected string and one (GSL4 of FIG. 23 or GSL 3 of FIG. 25) of the ground selection lines constituting the inhibited string can be in an equipotential state. FIG. 21 and FIGS. 23 through 25 show program and read operations according to certain embodiments. In other embodiments, ground selection lines GSL can also be electrically separated.

Figure 26:
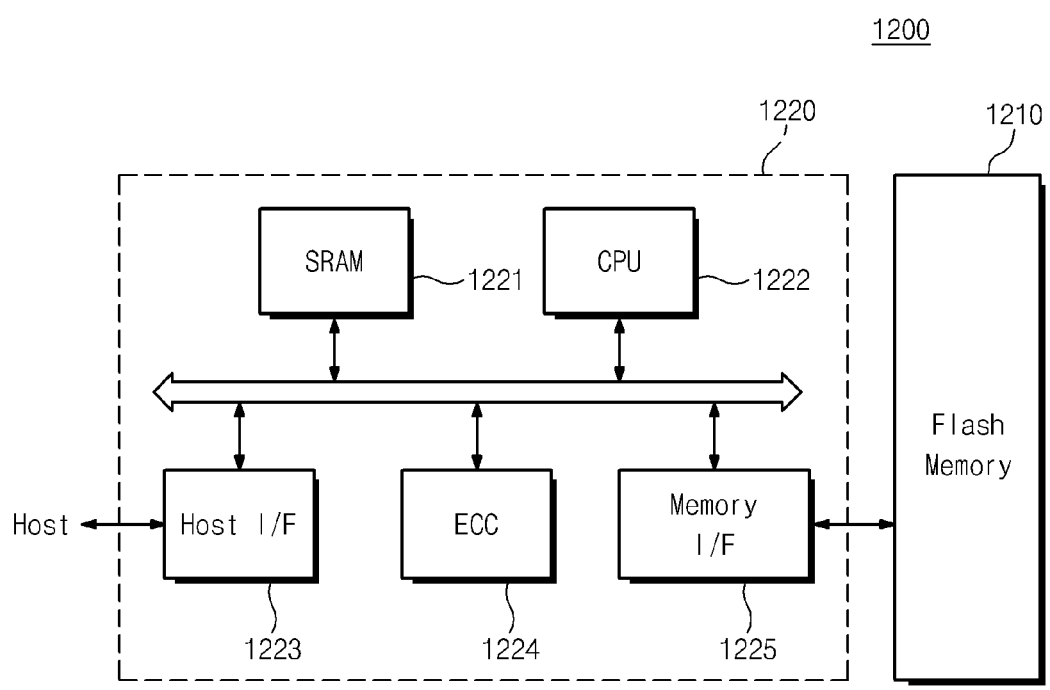
FIG. 26 is a block diagram of a memory card comprising a flash memory device according to an embodiment of the inventive concept.

FIG. 26 is a block diagram of a memory card 1200 comprising a flash memory device according to the inventive concept.

Referring to FIG. 26, memory card 1200 comprises a flash memory device 1210 and a memory controller 1220 that controls data exchange between a host and flash memory device 1210.

An SRAM 1221 is used as a working memory of a central processing unit (CPU) 1222. A host interface 1223 implements a data exchange protocol of a host connected to memory card 1200. An error correction code (ECC) 1224 detects and corrects errors included in data read from multi-bit flash memory 1210. A memory interface 1225 interfaces with flash memory device 1210. CPU 1222 controls operations for data exchange of memory controller 1220. Although not shown in the drawings, memory card 1200 can further comprise a ROM (not shown) storing code data for interfacing with the host.

In certain embodiments, a memory system with high reliability can be provided through flash memory device 1210 in which erase characteristics of dummy cells are improved. In some embodiments, the flash memory device can be provided in a memory system such as solid state disk ("SSD").

Figure 27:
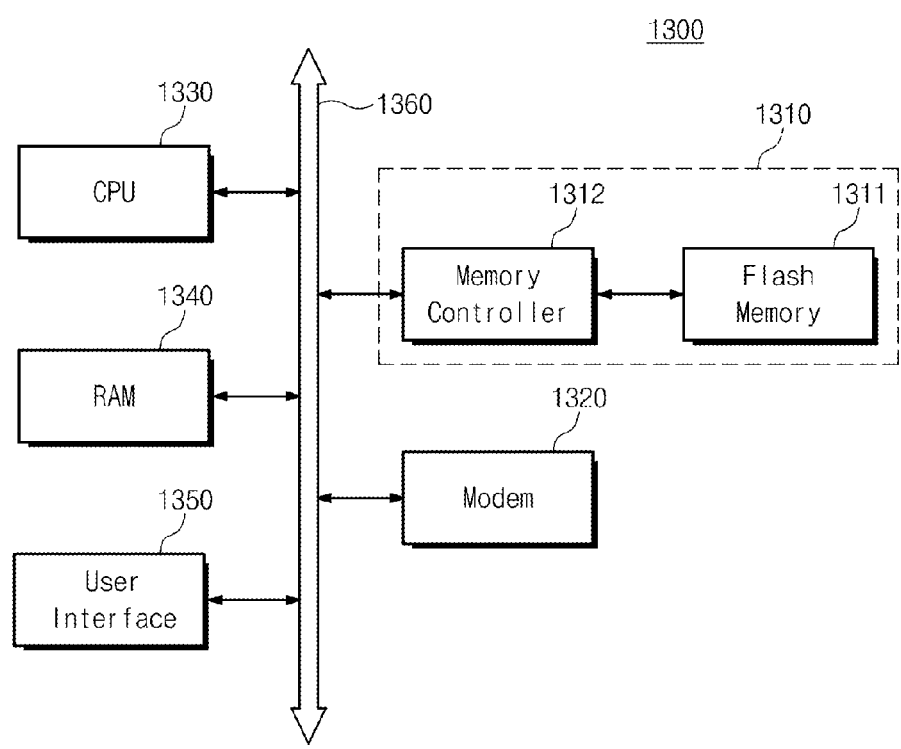
FIG. 27 is a block diagram of an information processing system comprising a flash memory system according to an embodiment of the inventive concept.

FIG. 27 is a block diagram of an information processing system 1300 comprising a flash memory system 1310 according to the inventive concept. Information processing system 1300 can comprise, for instance, a mobile device or a desktop computer.

Referring to FIG. 27, information processing system 1300 comprises flash memory system 1310, a modem 1320, a CPU 1330, a RAM 1340, and a user interface 1350 that are electrically connected to a system bus 1360. Flash memory system 1310 comprises a memory controller and a flash memory device having a configuration such as those described with reference to FIGS. 1 through 26. Data processed by CPU 1330 or external input data is stored in flash memory system 1310. As the reliability of the flash memory device in flash memory system 1310 is improved, flash memory system 1310 can save resources consumed in error correction, thus providing a high-speed data exchange function to information processing system 1300. Although not illustrated in the drawings, information processing system 1300 can further comprise an application chipset, a camera image processor (CIS), and an input/output device.

The devices and systems of FIGS. 1 through 27 can be mounted in various types of packages. Examples of these packages or package types include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline integrated circuit (SOIC), shrink small outline package (SSOP), thin small outline package (TSOP), thin quad flat pack (TQFP), system in package (SIP), multi chip package (MCP), wafer-level fabricated package (WFP), and wafer-level processed stack package (WSP).

As indicated by the foregoing, in various embodiments of the inventive concept, a three-dimensional semiconductor device comprises active patterns that are used as a current path for electrical connection to two different memory regions formed at the same height. Accordingly, two separate memory regions are formed around one active pattern and at the same height from a substrate. Accordingly, three-dimensional semiconductor devices according to the inventive concept can have an increased number of bits per unit area.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A three-dimensional semiconductor device, comprising:
   an electrode structure comprising a plurality of electrodes disposed at a plurality of levels one above the other in the device such that the electrode structure is three-dimensional;
   a plurality of active patterns each extending vertically through the electrode structure,
   wherein respective ones of the electrodes are disposed on opposite sides of each of the active patterns; and information storage elements disposed between the electrodes of the electrode structure and the plurality of active patterns,
wherein one of the electrodes disposed on one of the opposite sides of each of the active patterns is electrically isolated in the device from one of the electrodes disposed on the other of the opposite sides of the active pattern.

2. The three-dimensional semiconductor device of claim 1, wherein the electrode structure comprises first through m-th electrode groups each comprising a plurality of vertically stacked electrodes, the first through m-th electrode groups being arranged horizontally from the first electrode group to the m-th electrode group, where m is a natural number,
wherein the active patterns are disposed between a $(2n+1)$-th electrode group and a $(2n+2)$-th electrode group, where n is a natural number, and
at least one of the electrodes in the $(2n+1)$-th electrode group is electrically separated from all of the electrodes in the $(2n+2)$-th electrode group.

3. The three-dimensional semiconductor device of claim 2, wherein the three-dimensional semiconductor device comprises a first connection region, a second connection region, and a cell array region between the first connection region and the second connection region,
wherein electrodes in the $(2n+1)$-th electrode group and electrodes in a $(2n+3)$-th electrode group that are positioned at the same height are connected in the first connection region and are in an equipotential state, and
wherein electrodes in the $(2n+2)$-th electrode group and electrodes in a $(2n+4)$-th electrode group that are positioned at the same height are connected in the second connection region and are in an equipotential state.

4. The three-dimensional semiconductor device of claim 2, wherein the three-dimensional semiconductor device comprises a first connection region, a second connection region, and a cell array region between the first connection region and the second connection region,
wherein electrodes in the $(2n+2)$-th electrode group and electrodes in a $(2n+3)$-th electrode group that are positioned at the same height are connected to each other in the first connection region and are in an equipotential state, and
wherein electrodes in a $(2n+4)$-th electrode group and electrodes in a $(2n+5)$-th electrode group that are positioned at the same height are connected to each other in the second connection region and are in an equipotential state.

5. The three-dimensional semiconductor device of claim 2, wherein the three-dimensional semiconductor device comprises a first connection region, a second connection region, and a cell array region between the first connection region and the second connection region, and further comprises:
first interconnection lines connected to electrodes in the first connection region; and
second interconnection lines connected to electrodes in the second connection region.

6. The three-dimensional semiconductor device of claim 5, wherein each of the first interconnection lines electrically connects electrodes in the $(2n+1)$-th electrode group and a $(2n+3)$-th electrode group that are positioned at the same height, and each of the second interconnection lines electrically connects electrodes in the $(2n+2)$-th electrode group and a $(2n+4)$-th electrode group that are positioned at the same height.

7. The three-dimensional semiconductor device of claim 5, wherein each of the first interconnection lines electrically connects electrodes in the $(2n+2)$-th electrode group and a $(2n+3)$-th electrode group that are positioned at the same height, and each of the second interconnection lines electrically connects electrodes in a $(2n+4)$-th electrode group and a $(2n+5)$-th electrode group that are positioned at the same height.

8. The three-dimensional semiconductor device of claim 5, further comprising bit lines that are connected to the active patterns and cross the electrodes in the cell array region, wherein the first and second interconnection lines have substantially the same material, height, or thickness as the bit lines.

9. The three-dimensional semiconductor device of claim 1, further comprising:
a substrate disposed below the electrode structure; and
source lines disposed below the electrode structure,
wherein the source lines comprise a semiconductor material having a different conductivity type compared to the substrate and the active patterns.

10. The three-dimensional semiconductor device of claim 9, wherein the electrode structure comprises first through m-th electrode groups each comprising a plurality of vertically stacked electrodes, the first through m-th electrode groups being arranged horizontally from the first electrode group to the m-th electrode group, where m is a natural number, and
wherein the source lines comprise an impurity region formed in the substrate between a $(2n+2)$-th electrode group and a $(2n+3)$-th electrode group, where n is a natural number.

11. The three-dimensional semiconductor device of claim 1, further comprising:
semiconductor pads disposed on the active patterns; and
bit lines crossing the electrodes and electrically connected to the semiconductor pads,
wherein the semiconductor pads are formed of a semiconductor material having a different conductivity type from at least one portion of the active pattern.

12. The three-dimensional semiconductor device of claim 1, wherein each of the active patterns comprises a first region and a second region that are spaced apart from each other, and wherein the first and second regions are formed facing respective sidewalls of two adjacent electrode groups.

13. The three-dimensional semiconductor device of claim 12, wherein each of the active patterns further comprises a connection part connecting lower portions of the first and second regions.

14. The three-dimensional semiconductor device of claim 1, further comprising a substrate disposed below the electrode structure, wherein bottom surfaces of the active patterns are lower than a top surface of the substrate.

15. A three-dimensional semiconductor device, comprising:
a two-dimensional array of active patterns arranged on a substrate;
electrodes interposed between the active patterns, and wherein a plurality of the electrodes are disposed at each of a plurality of levels one above the other on the substrate such that the electrodes constitute a structure that is three-dimensional; and
memory regions located at points where the active patterns are closest to the electrodes, respectively,
wherein each of the active patterns provides a common path for current to two of the memory regions disposed at the same level as one another above the substrate.

16. The three-dimensional semiconductor device of claim 15, wherein one of the electrodes disposed on one of the opposite sides of each of the active patterns and another of the electrodes disposed on the other of the opposite sides of the active pattern at the same level above the substrate as said one of the electrodes are electrically isolated from each other in the device.

17. The three-dimensional semiconductor device of claim 16, wherein each of the active patterns comprises a first region and a second region spaced apart from each other, and the first and second regions are formed facing sidewalls of the two electrically isolated electrodes.

* * * * *